(12) United States Patent
Kishimoto

(10) Patent No.: US 10,991,919 B2
(45) Date of Patent: *Apr. 27, 2021

(54) METHOD AND APPARATUS FOR MANUFACTURING FLEXIBLE LIGHT EMITTING DEVICE

(71) Applicant: SAKAI DISPLAY PRODUCTS CORPORATION, Sakai (JP)

(72) Inventor: Katsuhiko Kishimoto, Sakai (JP)

(73) Assignee: SAKAI DISPLAY PRODUCTS CORPORATION, Sakai (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/970,288

(22) PCT Filed: May 9, 2018

(86) PCT No.: PCT/JP2018/017903
§ 371 (c)(1),
(2) Date: Oct. 8, 2020

(87) PCT Pub. No.: WO2019/215834
PCT Pub. Date: Nov. 14, 2019

(65) Prior Publication Data
US 2021/0074876 A1    Mar. 11, 2021

(51) Int. Cl.
*H01L 27/32* (2006.01)
*H01L 51/56* (2006.01)
(Continued)

(52) U.S. Cl.
CPC .......... *H01L 51/56* (2013.01); *H01L 27/3244* (2013.01); *H01L 33/0093* (2020.05); *H01L 51/0097* (2013.01); *H01L 51/5253* (2013.01)

(58) Field of Classification Search
CPC ... H01L 51/003; H01L 27/3244; H01L 51/56; H01L 51/5253; H01L 27/3293; H01L 51/0097; H01L 2251/566; H05B 33/10
See application file for complete search history.

(56) References Cited

U.S. PATENT DOCUMENTS

2006/0278333 A1  12/2006  Lee et al.
2015/0059987 A1   3/2015  Kumakura et al.
(Continued)

FOREIGN PATENT DOCUMENTS

JP    2006-330739 A    12/2006
JP    2012-226978 A    11/2012
(Continued)

*Primary Examiner* — Savitri Mulpuri
(74) *Attorney, Agent, or Firm* — ScienBiziP, P.C.

(57) ABSTRACT

According to a flexible light-emitting device production method of the present disclosure, after an intermediate region (30*i*) and a flexible substrate region (30*d*) of a plastic film (30) of a multilayer stack (100) are divided, the interface between the flexible substrate region (30*d*) and a glass base (10) is irradiated with lift-off light. The multilayer stack (100) is separated into the first portion (110) and the second portion (120) while the multilayer stack (100) is kept in contact with the stage (210). The first portion (110) includes a plurality of light-emitting devices (1000) which are in contact with the stage (210). The light-emitting devices (1000) include a plurality of functional layer regions (20) and the flexible substrate region (30*d*). The second portion (120) includes the glass base (10) and the intermediate region (30*i*). The step of irradiating with the lift-off light includes forming the lift-off light from a plurality of arranged light sources and temporally and spatially modulating a power of the plurality of lift-off light sources according to a shape of the flexible substrate region of the synthetic resin film such that the irradiation intensity of the lift-off light for at least part of the interface between the
(Continued)

intermediate region (30i) and the glass base (10) is lower than the irradiation intensity of the lift-off light for the interface between the flexible substrate region (30d) and the glass base (10).

15 Claims, 24 Drawing Sheets

(51) Int. Cl.
  *H01L 33/00* (2010.01)
  *H01L 51/52* (2006.01)
  *H01L 51/00* (2006.01)

(56) References Cited

U.S. PATENT DOCUMENTS

| | | |
|---|---|---|
| 2015/0155505 A1 | 6/2015 | Yamazaki et al. |
| 2015/0280127 A1 | 10/2015 | Suzuki et al. |
| 2017/0301860 A1 | 10/2017 | Yamazaki et al. |
| 2018/0017828 A1 | 1/2018 | Wang et al. |
| 2019/0244942 A1 | 8/2019 | Yamaguchi et al. |
| 2019/0363264 A1 | 11/2019 | Kishimoto et al. |
| 2019/0363299 A1 | 11/2019 | Kishimoto et al. |
| 2019/0392736 A1 | 12/2019 | Kishimoto et al. |

FOREIGN PATENT DOCUMENTS

| | | |
|---|---|---|
| JP | 2014-048619 A | 3/2014 |
| JP | 2015-173088 A | 10/2015 |
| JP | 2015-187701 A | 10/2015 |
| JP | 2015-195106 A | 11/2015 |
| JP | 2017-194682 A | 10/2017 |
| JP | 2018-010283 A | 1/2018 |
| JP | 6333502 B1 | 5/2018 |
| JP | 6334078 B1 | 5/2018 |
| JP | 6334079 B1 | 5/2018 |
| WO | 2015/190418 A1 | 12/2015 |
| WO | 2018/074611 A1 | 4/2018 |

215  400

215  400

METHOD AND APPARATUS FOR MANUFACTURING FLEXIBLE LIGHT EMITTING DEVICE

TECHNICAL FIELD

The present disclosure relates to a method and apparatus for producing a flexible light-emitting device.

BACKGROUND ART

A typical example of the flexible display includes a film which is made of a synthetic resin such as polyimide (hereinafter, referred to as "plastic film"), and elements supported by the plastic film, such as TFTs (Thin Film Transistors) and OLEDs (Organic Light Emitting Diodes). The plastic film functions as a flexible substrate. The flexible display is encapsulated with a gas barrier film (encapsulation film) because an organic semiconductor layer which is a constituent of the OLED is likely to deteriorate due to water vapor.

Production of the above-described flexible display is carried out using a glass base on which a plastic film is formed over the upper surface. The glass base functions as a support (carrier) for keeping the shape of the plastic film flat during the production process. TFT devices, light-emitting devices such as OLEDs, a gas barrier film, and the other constituents are formed on the plastic film, whereby the structure of a flexible display is realized while it is supported by the glass base. Thereafter, the flexible display is delaminated from the glass base and gains flexibility. The entirety of a portion in which TFT devices and light-emitting devices such as OLEDs are arrayed can be referred to as "functional layer region".

According to the prior art, a sheet-like structure including a plurality of flexible display is delaminated from a glass base, and thereafter, optical parts and other constituents are mounted to this sheet-like structure. Thereafter, the sheet-like structure is divided into a plurality of flexible devices. This dividing is realized by, for example, laser beam irradiation.

Patent Document No. 1 discloses the method of irradiating the interface between each flexible display and the glass base with laser light in order to delaminate each flexible display from the glass base (supporting substrate). According to the method disclosed in Patent Document No. 1, after irradiation with the lift-off light, respective flexible displays are divided from one another, and each of the flexible displays is delaminated from the glass base.

CITATION LIST

Patent Literature

Patent Document No. 1: Japanese Laid-Open Patent Publication No. 2014-48619

SUMMARY OF INVENTION

Technical Problem

According to the conventional production method, the dividing by means of laser beam irradiation is carried out after expensive parts, for example, encapsulation film, polarizer, and/or heat radiation sheet, are mounted to a sheet-like structure including a plurality of flexible displays. Therefore, unnecessary portions divided by laser beam irradiation, i.e., portions which are not to be constituents of a final display, are quite useless. Also, there is a problem that, after being delaminated from the glass base, it is difficult to handle a plurality of flexible displays which have no rigidity.

Such a problem is not limited to flexible displays which include OLEDs as light-emitting devices but can arise in producing a flexible light-emitting device which includes a micro LED (µLED) formed as a light-emitting device using inorganic semiconductor materials.

The present disclosure provides a method and apparatus for producing a flexible light-emitting device which are capable of solving the above-described problems.

Solution to Problem

The flexible light-emitting device production method of the present disclosure includes, in an exemplary embodiment: comprises, providing a multilayer stack which has a first surface and a second surface, the multilayer stack including a glass base which defines the first surface, a functional layer region including a TFT layer and a light-emitting device layer, a synthetic resin film provided between the glass base and the functional layer region and bound to the glass base, the synthetic resin film including a flexible substrate region supporting the functional layer region and an intermediate region surrounding the flexible substrate region, and a protection sheet which covers the functional layer region and which defines the second surface, dividing the intermediate region and the flexible substrate region of the synthetic resin film from each other, irradiating an interface between the synthetic resin film and the glass base with lift-off light, and separating the multilayer stack into a first portion and a second portion by increasing a distance from a stage to the glass base while the second surface of the multilayer stack is kept in contact with the stage. The first portion of the multilayer stack includes a light-emitting device which is in contact with the stage, the light-emitting device including the functional layer region and the flexible substrate region of the synthetic resin film. The second portion of the multilayer stack includes the glass base and the intermediate region of the synthetic resin film. The method further comprises irradiating the interface between the synthetic resin film and the glass base with the lift-off light includes forming the lift-off light from a plurality of arranged light sources and temporally and spatially modulating a power of the plurality of light sources according to a shape of the flexible substrate region of the synthetic resin film such that an irradiation intensity of the lift-off light for at least part of an interface between the intermediate region of the synthetic resin film and the glass base is lower than an irradiation intensity of the lift-off light for the interface between the flexible substrate region of the synthetic resin film and the glass base.

In one embodiment, the lift-off light is incoherent light.

In one embodiment, the light-emitting device layer includes a plurality of arrayed micro LEDs, and the lift-off light is laser light.

In one embodiment, a shape of the flexible substrate region of the synthetic resin film has a cutout, a protrusion, and/or a curved contour when viewed in a direction perpendicular to the first surface.

In one embodiment, a number of the flexible substrate region of the synthetic resin film is plural, and a number of the light-emitting device included in the first portion of the multilayer stack is plural.

In one embodiment, the plurality of light sources are a plurality of light emitting diode devices, and irradiating the interface between the synthetic resin film and the glass base with the lift-off light includes modulating a driving current flowing through each of the plurality of light emitting diode devices, thereby temporally and/or spatially modulating the irradiation intensity of the lift-off light.

In one embodiment, the plurality of light emitting diode devices are arranged in a single row or a plurality of rows.

In one embodiment, an arrangement pitch of the plurality of light emitting diode devices is in a range of not less than 3 mm and not more than 10 mm.

In one embodiment, the lift-off light is a line beam extending in a first direction which is parallel to a perimeter of the glass base, and irradiating the interface between the synthetic resin film and the glass base with the lift-off light includes moving an irradiation region on the interface which is to be irradiated with the lift-off light in a second direction which is transverse to the first direction.

In one embodiment, the lift-off light is plane-like light extending in a first direction and a second direction, the first direction being parallel to a perimeter of the glass base, the second direction being transverse to the first direction, and irradiating the interface between the synthetic resin film and the glass base with the lift-off light includes moving or not-moving irradiation region on the interface which is to be irradiated with the lift-off light.

In one embodiment, the at least part of the interface between the intermediate region of the synthetic resin film and the glass base includes a plurality of parallel stripe regions extending in the first direction, and any of the plurality of parallel stripe regions includes a large-width portion and/or a narrow-width portion.

In one embodiment, the at least part of the interface between the intermediate region of the synthetic resin film and the glass base includes a plurality of parallel stripe regions extending in the second direction, and any of the plurality of parallel stripe regions includes a large-width portion and/or a narrow-width portion.

In one embodiment, the at least part of the interface between the intermediate region of the synthetic resin film and the glass base has a width which is not less than 50% of a width of the intermediate region.

In one embodiment, the at least part of the interface between the intermediate region of the synthetic resin film and the glass base has a width which is not less than 1 mm.

In one embodiment, the difference between an irradiation intensity of the lift-off light in the at least part of the interface between the intermediate region of the synthetic resin film and the glass base and an irradiation intensity of the lift-off light for the interface between the flexible substrate region of the synthetic resin film and the glass base is not less than 50 mJ/cm$^2$.

In one embodiment, the method further comprises, after separating the multilayer stack into the first portion and the second portion, performing a process on the light-emitting device which is in contact with the stage.

The flexible light-emitting device production apparatus of the present disclosure includes, in an exemplary embodiment: a stage for supporting a multilayer stack which has a first surface and a second surface, the multilayer stack including a glass base which defines the first surface, a functional layer region including a TFT layer and a light-emitting device layer, a synthetic resin film provided between the glass base and the functional layer region and bound to the glass base, the synthetic resin film including a flexible substrate region supporting the functional layer region and an intermediate region surrounding the flexible substrate region, and a protection sheet which covers the functional layer region and which defines the second surface, the intermediate region and the flexible substrate region of the synthetic resin film being divided from each other, and a lift-off light irradiation unit for irradiating with lift-off light an interface between the synthetic resin film and the glass base in the multilayer stack supported by the stage. The lift-off light irradiation unit includes a plurality of arranged light sources for forming the lift-off light. The lift-off light irradiation unit temporally and spatially modulates a power of the plurality of light sources according to a shape of the flexible substrate region of the synthetic resin film such that an irradiation intensity of the lift-off light for at least part of an interface between the intermediate region of the synthetic resin film and the glass base is lower than an irradiation intensity of the lift-off light for the interface between the flexible substrate region of the synthetic resin film and the glass base.

In one embodiment, each of the plurality of arranged light sources is an incoherent light source.

In one embodiment, the light-emitting device layer includes a plurality of arrayed micro LEDs, and each of the plurality of light sources is a semiconductor laser device.

In one embodiment, the plurality of light sources are a plurality of light emitting diode devices, and the lift-off light irradiation unit includes a driving circuit for modulating a driving current flowing through each of the plurality of light emitting diode devices, thereby temporally and/or spatially modulating the irradiation intensity of the lift-off light.

In one embodiment, the plurality of light emitting diode devices are arranged in a single row or a plurality of rows.

In one embodiment, an arrangement pitch of the plurality of light emitting diode devices is in a range of not less than 3 mm and not more than 10 mm.

In one embodiment, the apparatus further comprises an actuator for increasing a distance from the stage to the glass base while the stage is kept in contact with the second surface of the multilayer stack, thereby separating the multilayer stack into a first portion and a second portion. The first portion of the multilayer stack includes a light-emitting device which is in contact with the stage.

The light-emitting device includes the functional layer region and the flexible substrate region of the synthetic resin film, and the second portion of the multilayer stack includes the glass base and the intermediate region of the synthetic resin film.

The lift-off light irradiation apparatus for irradiating an interface between a glass base and a synthetic resin film formed on the glass base with lift-off light of the present disclosure includes, in an exemplary embodiment: a plurality of light emitting diodes each emitting ultraviolet light to form the lift-off light, a driving circuit for driving each of the plurality of light emitting diodes, and a controller configured to control the driving circuit to modulate temporally and spatially an intensity of the lift-off light.

Advantageous Effects of Invention

According to an embodiment of the present invention, a novel method for producing a flexible light-emitting device which is capable of solving the above-described problems is provided.

DESCRIPTION OF EMBODIMENTS

An embodiment of a method and apparatus for producing a flexible light-emitting device of the present disclosure is described with reference to the drawings. Examples of the "light-emitting device" include displays and illumination devices. In the following description, unnecessarily detailed description will be omitted. For example, detailed description of well-known matter and repetitive description of substantially identical elements will be omitted. This is for the purpose of avoiding the following description from being unnecessarily redundant and assisting those skilled in the art to easily understand the description. The present inventor provides the attached drawings and the following description for the purpose of assisting those skilled in the art to fully understand the present disclosure. Providing these drawings and description does not intend to limit the subject matter recited in the claims.

<Multilayer Stack>

Figure 1A:
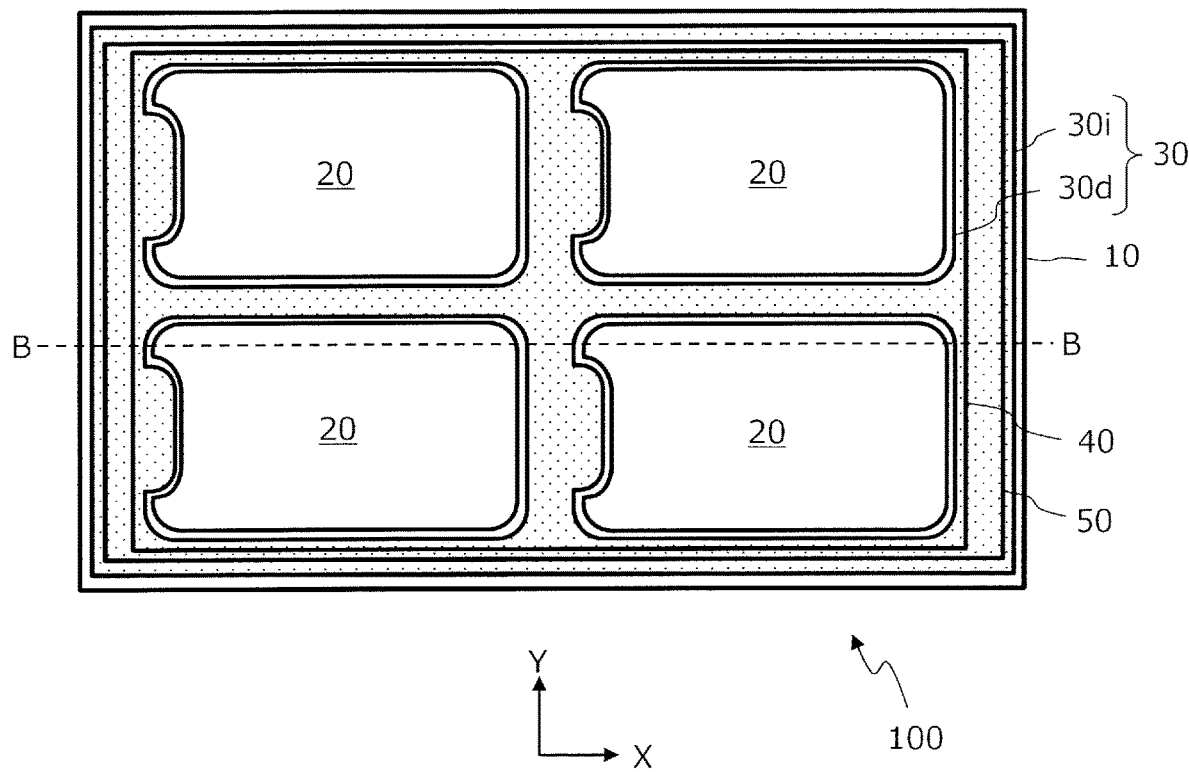
FIG. 1A is a plan view showing a configuration example of a multilayer stack used in a flexible light-emitting device production method of the present disclosure.
Figure 1B:
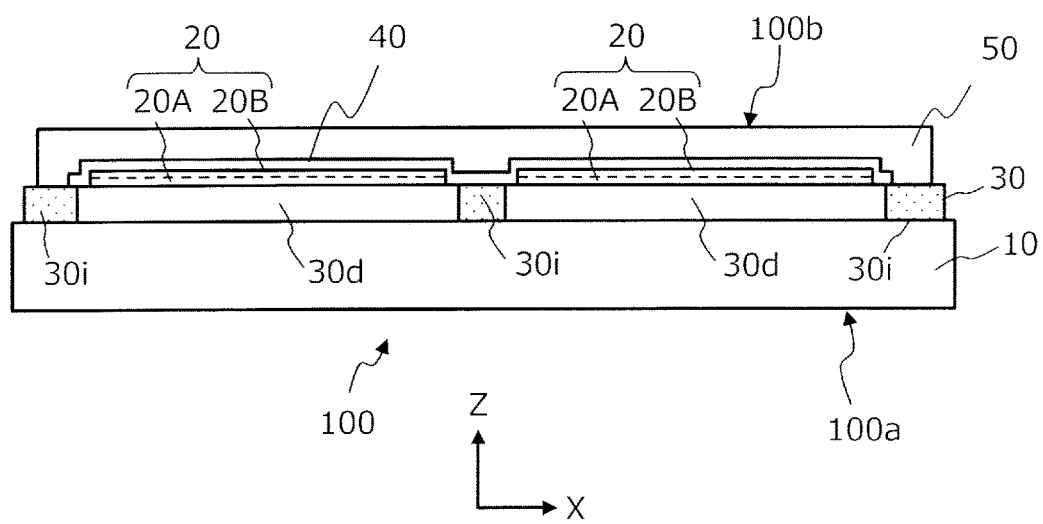
FIG. 1B is a cross-sectional view of the multilayer stack taken along line B-B of FIG. 1A.

See FIG. 1A and FIG. 1B. In a flexible light-emitting device production method of the present embodiment, firstly, a multilayer stack 100 illustrated in FIG. 1A and FIG. 1B is provided. FIG. 1A is a plan view of the multilayer stack 100. FIG. 1B is a cross-sectional view of the multilayer stack 100 taken along line B-B of FIG. 1A. In FIG. 1A and FIG. 1B, an XYZ coordinate system with X-axis, Y-axis and Z-axis, which are perpendicular to one another, is shown for reference.

The multilayer stack 100 includes a glass base (motherboard or carrier) 10, a plurality of functional layer regions 20 each including a TFT layer 20A and a light-emitting device layer 20B, a synthetic resin film (hereinafter, simply referred to as "plastic film") 30 provided between the glass base 10 and the plurality of functional layer regions 20 and bound to the glass base 10, and a protection sheet 50 covering the plurality of functional layer regions 20. The multilayer stack 100 further includes a gas barrier film 40 provided between the plurality of functional layer regions 20 and the protection sheet 50 so as to cover the entirety of the functional layer regions 20. The multilayer stack 100 may include another unshown layer, such as a buffer layer.

In the present embodiment, the light-emitting device layer 20B includes, for example, a plurality of OLED devices which are two-dimensionally arrayed. In the present disclosure, the "light-emitting device layer" refers to a two-dimensional array of light-emitting devices. Each of the light-emitting devices is not limited to an OLED device but may be a micro LED device. In the present embodiment, a typical example of the flexible light-emitting device is a "flexible display" but may be a "flexible illumination device".

The first surface 100a of the multilayer stack 100 is defined by the glass base 10. The second surface 100b of the multilayer stack 100 is defined by the protection sheet 50. The glass base 10 and the protection sheet 50 are materials temporarily used in the production process but are not constituents of a final flexible light-emitting device.

The plastic film 30 shown in the drawings includes a plurality of flexible substrate regions 30d respectively supporting the plurality of functional layer regions 20, and an intermediate region 30i surrounding each of the flexible substrate regions 30d. The flexible substrate regions 30d and the intermediate region 30i are merely different portions of a single continuous plastic film 30 and do not need to be physically distinguished. In other words, regions of the plastic film 30 lying immediately under respective ones of the functional layer regions 20 are the flexible substrate regions 30d, and the other region of the plastic film 30 is the intermediate region 30i.

Each of the plurality of functional layer regions 20 is a constituent of a final flexible light-emitting device (e.g., display panel). In other words, the multilayer stack 100 has such a structure that a plurality of flexible light-emitting devices which are not yet divided from one another are supported by a single glass base 10. Each of the functional layer regions 20 has such a shape that, for example, the thickness (size in Z-axis direction) is several tens of micrometers, the length (size in X-axis direction) is about 12 cm, and the width (size in Y-axis direction) is about 7 cm. These sizes can be set to arbitrary values according to the required largeness of the display screen or emission surface region.

Figure 1C:
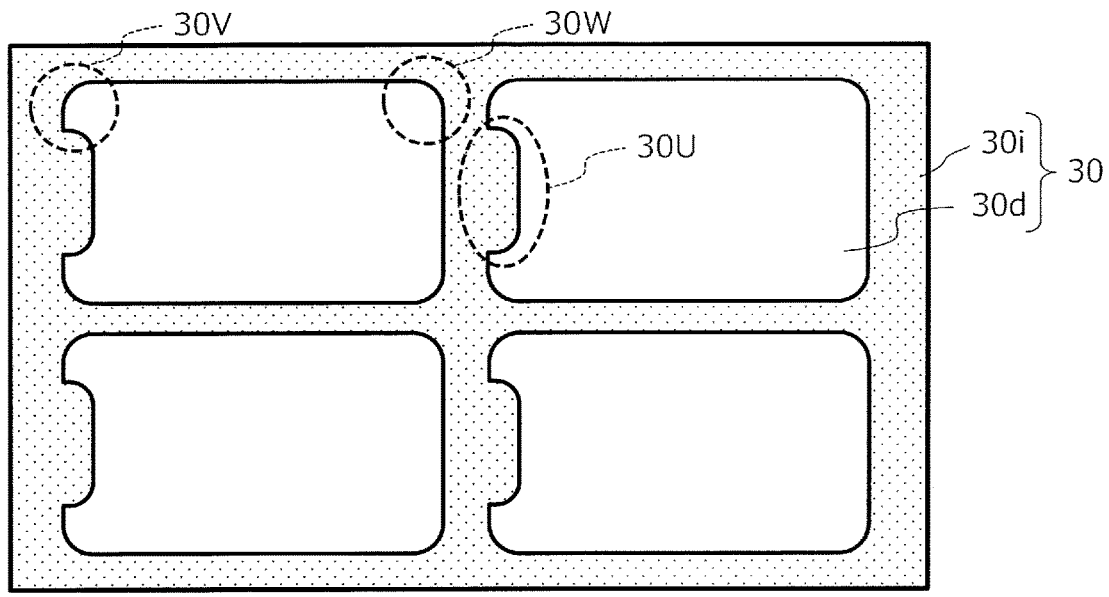
FIG. 1C is a plan view showing a configuration example of a plastic film in the multilayer stack.

Next, a configuration example of the flexible substrate regions 30d and the intermediate region 30i of the present embodiment is described in more detail with reference to FIG. 1C. FIG. 1C is a plan view showing an example of the layout of the flexible substrate regions 30d and the intermediate region 30i of the plastic film 30 of the present embodiment.

In the example illustrated in the drawing, the shape of each of the flexible substrate regions 30d includes a cutout 30U, protrusions 30V, and curved contour portions 30W. The shape of the flexible substrate regions 30d is conformable to the shape of the flexible light-emitting devices shown in FIG. 1A. In the present embodiment, the flexible light-emitting devices have a shape different from a simple rectangle. For example, this shape is conformable to the design of an electronic device to which a narrow-frame flexible light-emitting device is mounted as a display device, such as smartphone, tablet computer, and television set. More specifically, in addition to the display device, parts, such as camera, loudspeaker, and physical switch, can be mounted to such an electronic device. The cutout 30U of the flexible substrate regions 30d shown in FIG. 1C can be provided in a region in which such parts are to be placed.

The plurality of flexible substrate regions 30d are two-dimensionally arrayed in rows and columns according to the arrangement of corresponding flexible light-emitting devices. The intermediate region 30i consists of a plurality of stripes perpendicular to one another and forms a grid pattern. The stripes can include large-width portions and narrow-width portions which accord with the recesses and protrusions of the flexible substrate regions 30d. In the present embodiment, the width of each stripe is, for example, about 1-10 mm. The flexible substrate region 30d of the plastic film 30 functions as the "flexible substrate" in each flexible light-emitting device which is in the form of a final product. Meanwhile, the intermediate region 30i of the plastic film 30 is not a constituent of the final product.

In an embodiment of the present disclosure, the configuration of the multilayer stack 100 is not limited to the example illustrated in the drawings. The number of functional layer regions 20 (the number of light-emitting devices) supported by a single glass base 10 does not need to be plural but may be singular. If the number of functional layer regions 20 is singular, the intermediate region 30i of the plastic film 30 forms a simple frame pattern surrounding a single functional layer region 20.

Figure 1D:
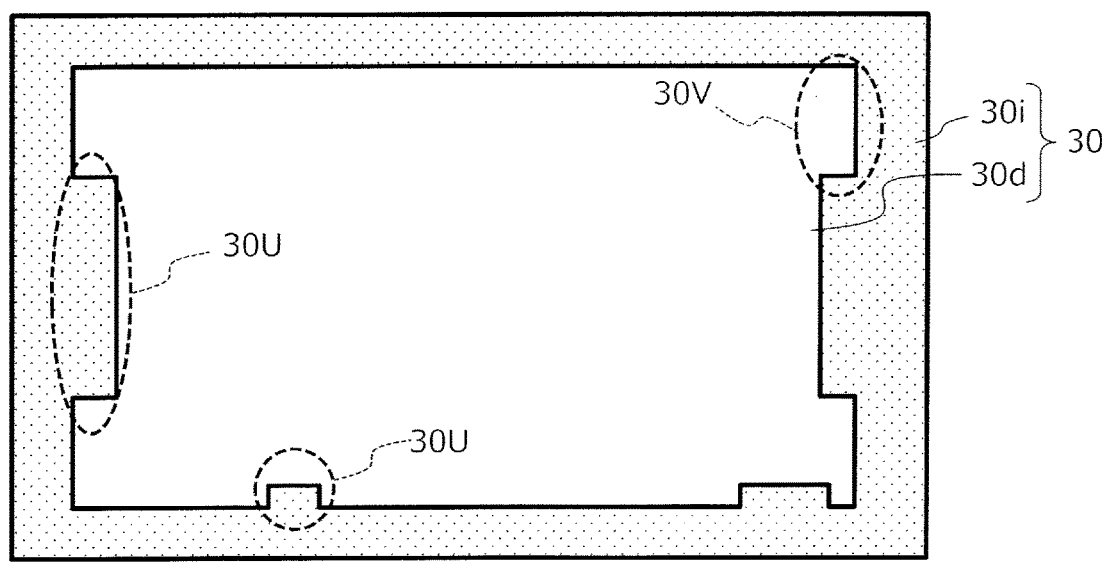
FIG. 1D is a plan view showing another configuration example of a plastic film in the multilayer stack.

FIG. 1D is a plan view showing a configuration example of the plastic film 30 where the number of light-emitting devices supported by a single glass base 10 is one. In this example, the shape of the flexible substrate region 30d has a cutout 30U and a protrusion 30V. The shape of this flexible substrate region 30d is conformable to the shape of a flexible light-emitting device which can be used for a large-sized television set or monitor. The cutout 30U of the flexible substrate region 30d can be provided in a region in which parts, such as camera, loudspeaker, and physical switch, are to be placed. In this example, a single flexible light-emitting device can be formed on a glass base 10 which has the size of, for example, 1.5 m×0.9 m.

The size or proportion of each component illustrated in respective drawings is determined from the viewpoint of understandability. The actual size or proportion is not necessarily reflected in the drawings.

Figure 1E:
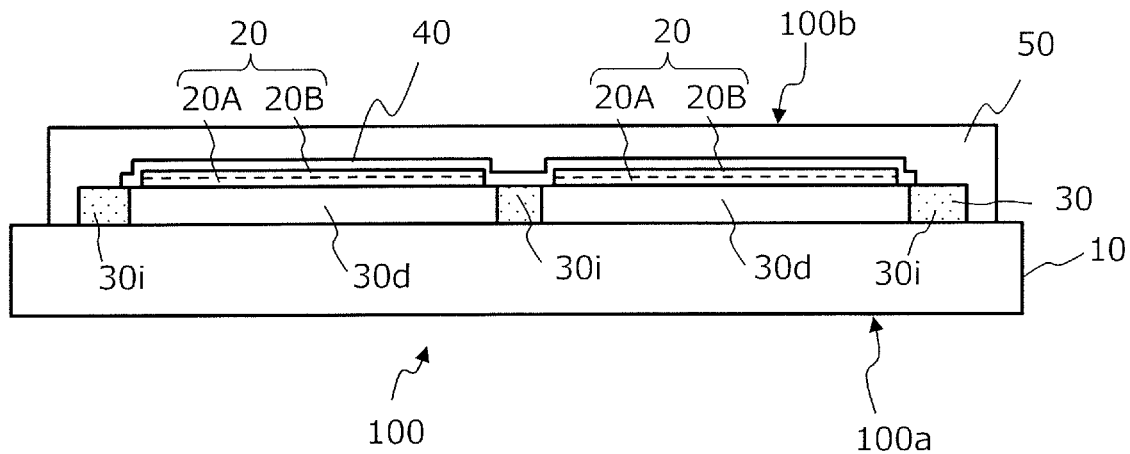
FIG. 1E is a cross-sectional view showing another example of the multilayer stack.
Figure 1F:
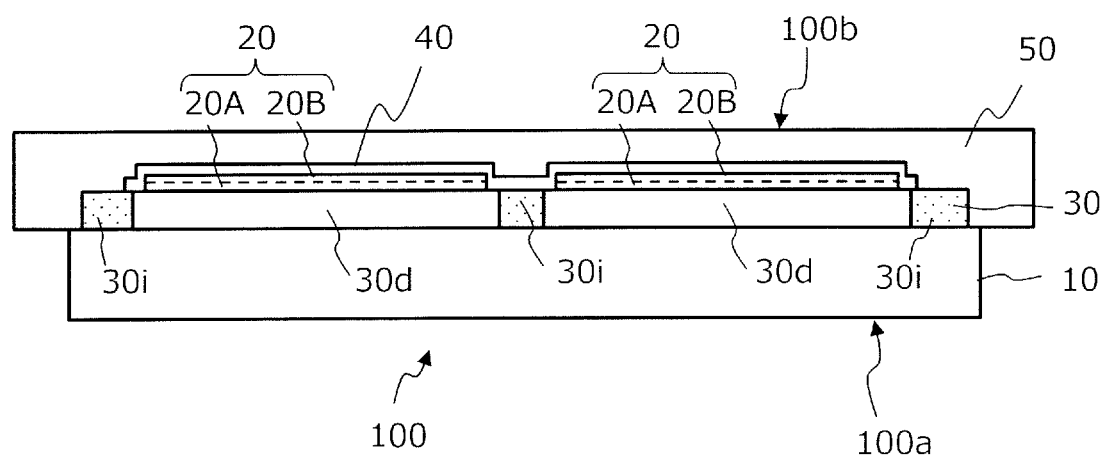
FIG. 1F is a cross-sectional view showing still another example of the multilayer stack.

The multilayer stack 100 which can be used in the production method of the present disclosure is not limited to the example illustrated in FIG. 1A and FIG. 1B. FIG. 1E and FIG. 1F are cross-sectional views showing other examples of the multilayer stack 100. In the example illustrated FIG. 1E, the protection sheet 50 covers the entirety of the plastic film 30 and extends outward beyond the plastic film 30. In the example illustrated FIG. 1F, the protection sheet 50 covers the entirety of the plastic film 30 and extends outward beyond the glass base 10. As will be described later, after the glass base 10 is separated from the multilayer stack 100, the multilayer stack 100 is a thin flexible sheet-like structure which has no rigidity. The protection sheet 50 serves to protect the functional layer regions 20 from impact and abrasion when the functional layer regions 20 collide with or come into contact with external apparatuses or instruments in the step of delaminating the glass base 10 and the steps after the delaminating. Since the protection sheet 50 is peeled off from the multilayer stack 100 in the end, a typical example of the protection sheet 50 has a laminate structure which includes an adhesive layer of a relatively small adhesive force (a layer of an applied mold-releasing agent) over its surface. The more detailed description of the multilayer stack 100 will be described later.

<Dividing of Light-Emitting Devices>

According to the flexible light-emitting device production method of the present embodiment, after the step of providing the above-described multilayer stack 100, the step of dividing an intermediate region 30i and respective ones of a plurality of flexible substrate regions 30d of the plastic film 30 from one another is carried out.

Figure 2:
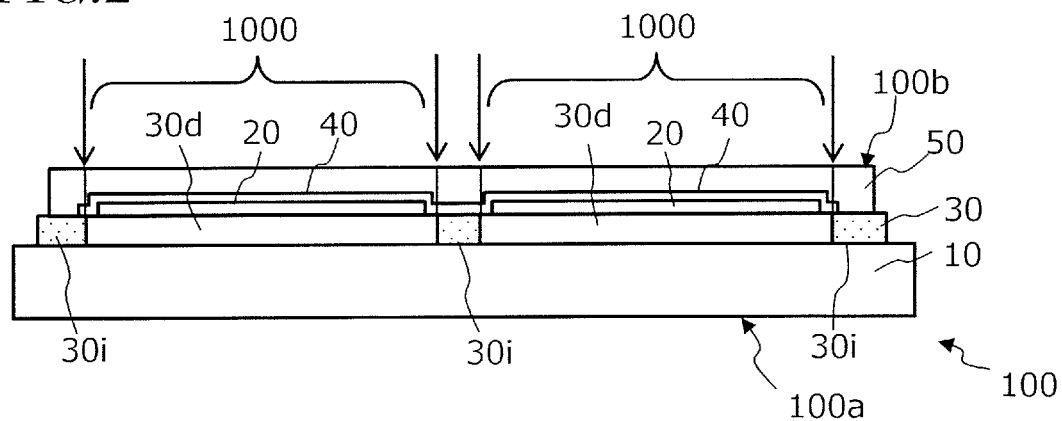
FIG. 2 is a cross-sectional view schematically showing the dividing positions in the multilayer stack.

FIG. 2 is a cross-sectional view schematically showing the positions for dividing the intermediate region 30i and respective ones of the plurality of flexible substrate regions 30d of the plastic film 30 from one another. The positions of irradiation extend along the periphery of each of the flexible substrate regions 30d. In FIG. 2, the positions indicated by arrows are irradiated with a laser beam for cutting. Part of the multilayer stack 100 exclusive of the glass base 10 is cut into a plurality of light-emitting devices (e.g., display panels) 1000 and the remaining unnecessary portions. By cutting, a gap of several tens of micrometers to several hundreds of micrometers is formed between each of the light-emitting devices 1000 and a portion surrounding the light-emitting device 1000. The cutting can also be realized by a cutter which has a fixed blade or a rotary blade instead of the laser beam irradiation. Since the periphery of the flexible substrate regions 30d has complicated recesses and protrusions and curves as shown in FIG. 1C, the cutting is desirably realized by the laser beam irradiation. After the cutting, the light-emitting devices 1000 and the remaining unnecessary portions remain bound to the glass base 10.

When the cutting is realized by a laser beam, the wavelength of the laser beam may be in any of the infrared, visible and ultraviolet bands. From the viewpoint of reducing the effect of the cutting on the glass base 10, the laser beam desirably has a wavelength in the range of green to ultraviolet. For example, when a Nd:YAG laser apparatus is used, the cutting can be carried out using a second harmonic wave (wavelength: 532 nm) or a third harmonic wave (wavelength: 343 nm or 355 nm). In such a case, the laser power is adjusted to 1 to 3 watts, and the scanning rate is set to about 500 mm per second, so that the multilayer structure supported by the glass base 10 can be cut (divided) into Light-emitting devices and unnecessary portions without damaging the glass base 10.

According to the embodiment of the present disclosure, the timing of the above-described cutting is earlier than in the prior art. Since the cutting is carried out while the plastic film 30 is bound to the glass base 10, alignment for the cutting can be made with high precision and accuracy even if the gap between adjoining light-emitting devices 1000 is narrow. Thus, the gap between adjoining light-emitting devices 1000 can be shortened, and accordingly, useless portions which are unnecessary for a final product can be reduced. In the prior art, after the delaminating from the glass base 10, a polarizer, a heat radiation sheet, and/or an electromagnetic shield can be adhered to the plastic film 30 so as to cover the entirety of the surface (delaminated surface) of the plastic film 30. In such a case, the polarizer, the heat radiation sheet, and/or the electromagnetic shield are also divided by cutting into portions covering the light-emitting devices 1000 and the remaining unnecessary portions. The unnecessary portions are disposed of as waste. On the other hand, according to the production method of the present disclosure, production of such waste can be suppressed as will be described later.

<Lift-Off Light Irradiation>

After the intermediate region 30i and respective ones of the plurality of flexible substrate regions 30d of the plastic film 30 are divided from one another, the step of irradiating the interface between the flexible substrate regions 30d of the plastic film 30 and the glass base 10 with lift-off light is carried out using a lift-off light irradiation unit.

Figure 3A:
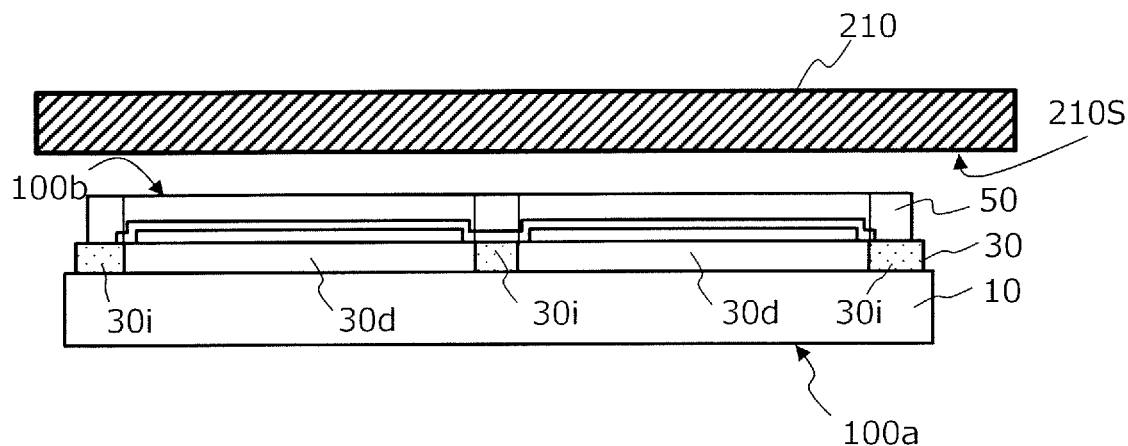
FIG. 3A is a diagram schematically showing a state immediately before a stage supports a multilayer stack.

FIG. 3A schematically shows a state immediately before the stage 210 supports the multilayer stack 100. In the present embodiment, the stage 210 is a chuck stage which has a large number of pores in the surface for suction. The multilayer stack 100 is arranged such that the second surface 100b of the multilayer stack 100 faces the surface 210S of the stage 210, and is supported by the stage 210.

Figure 3B:
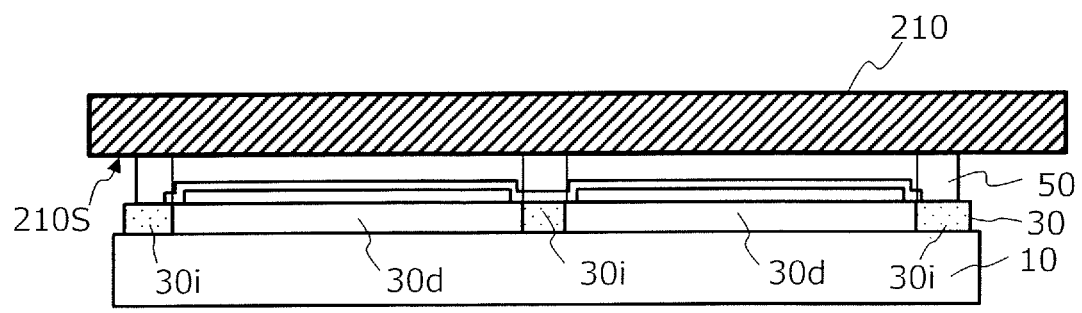
FIG. 3B is a diagram schematically showing a state where the stage supports the multilayer stack.

FIG. 3B schematically shows a state where the stage 210 supports the multilayer stack 100. The arrangement of the stage 210 and the multilayer stack 100 is not limited to the example illustrated in the drawing. For example, the multilayer stack 100 may be placed upside down such that the stage 210 is present under the multilayer stack 100.

In the example illustrated in FIG. 3B, the multilayer stack 100 is in contact with the surface 210S of the stage 210, and the stage 210 holds the multilayer stack 100 by suction.

Figure 3C:
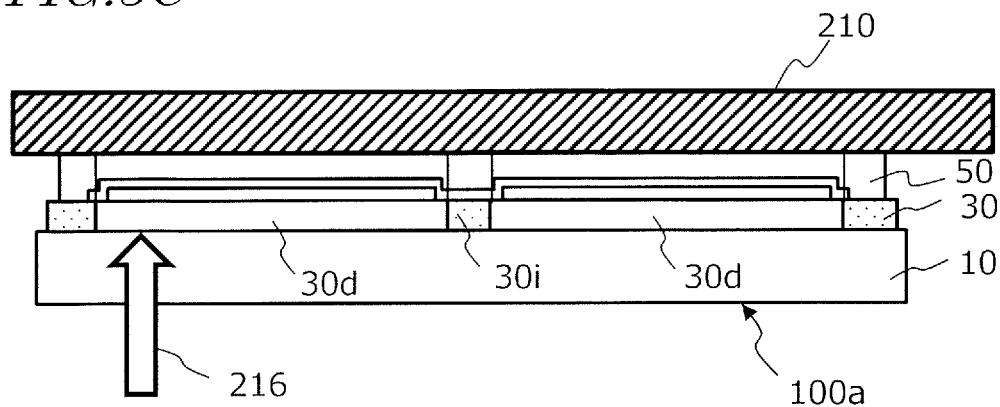
FIG. 3C is a diagram schematically showing that the interface between a glass base and a plastic film of the multilayer stack with lift-off light.

Then, as shown in FIG. 3C, the interface between the plastic film 30 and the glass base 10 is irradiated with lift-off light 216. FIG. 3C schematically illustrates irradiation of the interface between the glass base 10 and the plastic film 30 of the multilayer stack 100 with the lift-off light 216 in the shape of a line extending in a direction vertical to the sheet of the drawing. A part of the plastic film 30 at the interface between the glass base 10 and the plastic film 30 absorbs the lift-off light 216 and decomposes (disappears). By scanning the above-described interface with the lift-off light 216, the degree of binding of the plastic film 30 to the glass base 10 is reduced. The wavelength of the lift-off light 216 is typically in the ultraviolet band. The wavelength of the lift-off light 216 is selected such that the lift-off light 216 is hardly absorbed by the glass base 10 but is absorbed by the plastic film 30 as much as possible. The light absorption by the glass base 10 is, for example, about 10% in the wavelength range of 343-355 nm but can increase to 30-60% at 308 nm.

Hereinafter, lift-off light irradiation according to the present embodiment is described in detail.

<Lift-Off Light Irradiation Unit 1>

In the present embodiment, the lift-off light irradiation unit includes a line beam source for emitting lift-off light 216. The line beam source includes a laser apparatus and a plurality of arranged laser light sources. In the present embodiment, a typical example of the laser light sources is a semiconductor laser device (laser diode, also referred to as "LD"). In contrast, a typical example of a conventional lift-off light irradiation unit is a combination of a gas laser apparatus such as excimer laser or a solid state laser apparatus such as YAG laser and an optical system consisting of lenses and prisms for reshaping laser light in the form of a spot beam emitted from the laser apparatus into a line beam. In the present disclosure, the lift-off light irradiation unit is simply referred to as "delaminating apparatus". Note that, in conventional delaminating apparatuses, if the line length of a line beam to be produced is 1 m or more, the optical system for reshaping the laser light is too big to construct and, accordingly, deterioration of the quality (uniformity) of the line beam is inevitable. Thus, the longest possible line beam has a length corresponding to the G6H substrate size (the shorter side of a 1800 mm×750 mm rectangle), i.e., a beam length up to about 750 mm.

Figure 4:
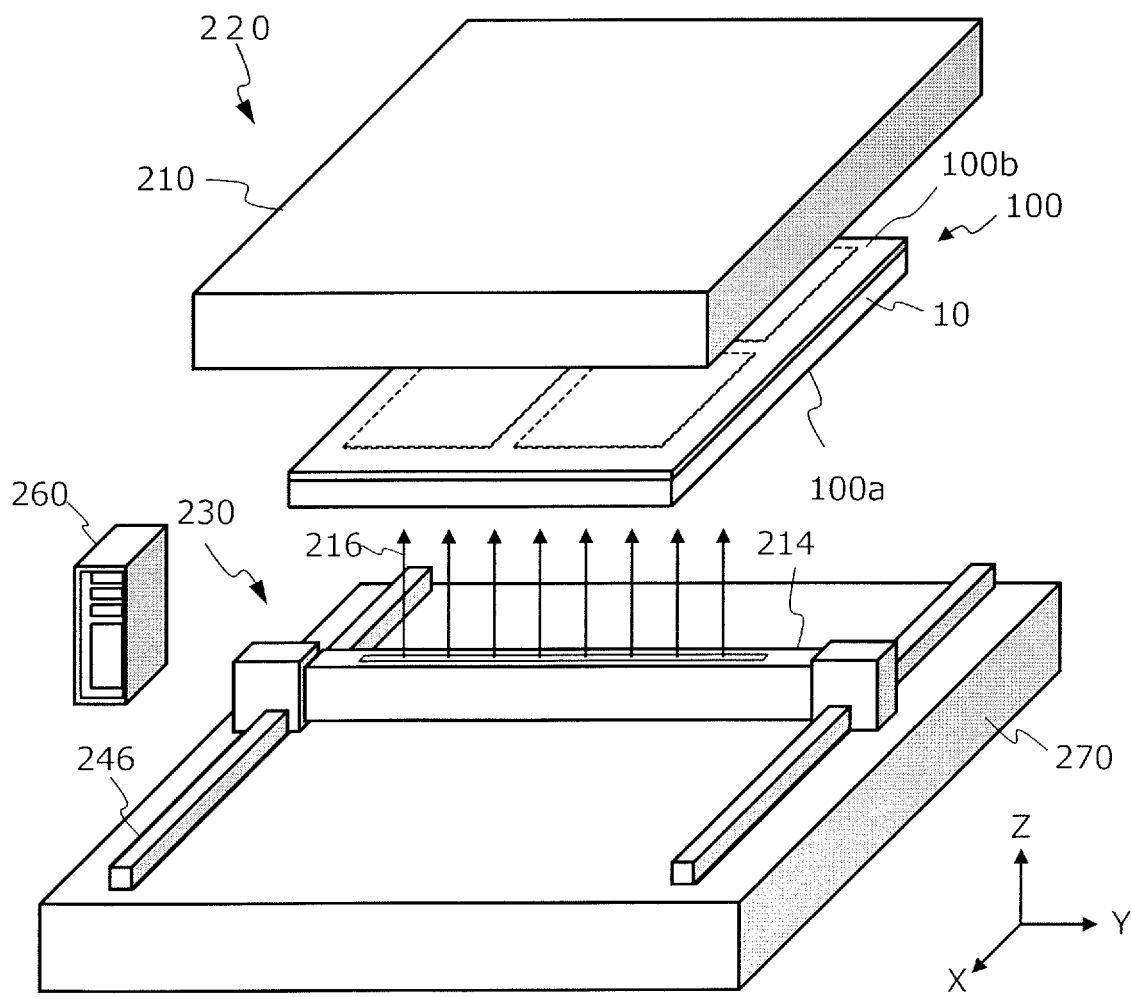
FIG. 4 is a perspective view schematically showing irradiation of a multilayer stack with laser light (lift-off light) emitted from a laser light source of a lift-off light irradiation unit.

FIG. 4 is a perspective view schematically showing irradiation of the multilayer stack 100 with a line beam (lift-off light 216) emitted from the line beam source 214 of a delaminating apparatus 220 of the present embodiment. For the sake of understandability, the stage 210, the multilayer stack 100 and the line beam source 214 are shown as being spaced away from one another in the Z-axis direction of the drawing. During irradiation with the lift-off light 216, the second surface 100b of the multilayer stack 100 is in contact with the stage 210. When a plurality of thus-arrayed laser light sources are used, the line length of the lift-off light in the shape of a line beam can easily be 1 m or more, and the delaminating apparatus is applicable to G8-size substrates (2400 mm×2200 mm) or huge substrates of still larger sizes, to which conventional delaminating apparatuses are not applicable.

The delaminating apparatus 220 illustrated in FIG. 4 includes a transporting device 230 for moving the line beam source 214 such that the irradiation position of the line beam on the multilayer stack 100 moves in a direction transverse to the line beam (scanning direction). The transporting device 230 illustrated in the drawing includes a supporting base 270 and a guide rail 246 for guiding the movement of the line beam source 214. The transporting device 230 includes an actuator such as, for example, a motor and is capable of moving the line beam source 214. The motor may be a rotating electric machine, such as DC motor, three-phase AC motor, stepping motor, or may be a linear motor or an ultrasonic motor. When an ultrasonic motor is used, highly-accurate positioning is possible as compared with the other types of motors. Further, the ultrasonic motor provides large holding power when it is not moving, and can hold without supply of electric power. Therefore, the heat generation is small when it is not moving.

Figure 5:
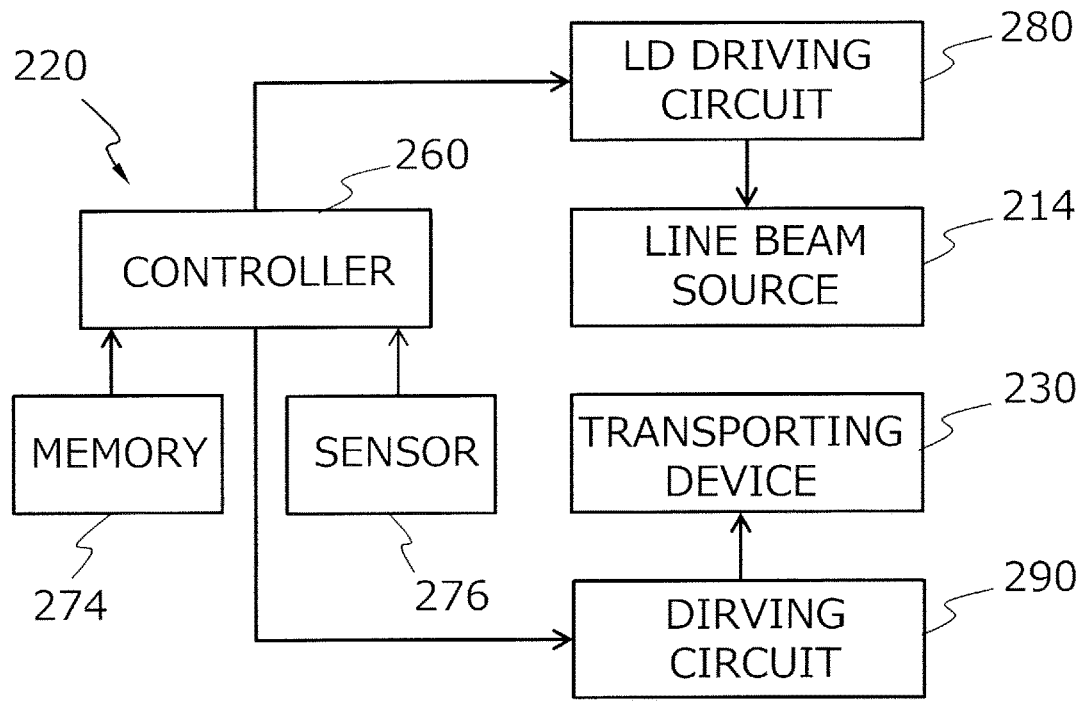
FIG. 5 is a block diagram schematically showing the flow of signals, data and instructions in the lift-off light irradiation unit.

Next, see FIG. 5. FIG. 5 is a block diagram schematically showing the flow of signals, data and instructions in the delaminating apparatus 220.

The controller 260 is typically a computer. A part or the entirety of the controller 260 can be a general-purpose or special-purpose computer system. The computer system includes an OS (operating system) and, when necessary, hardware devices such as peripheral devices. The controller 260 is connected with a memory 274 which is a computer-readable storage medium. In the memory 274, a program is stored which defines the operation of the delaminating apparatus 220.

In FIG. 5, for the sake of simplicity, a single memory unit is shown. However, the actual memory 274 can consist of a plurality of storage devices of an identical type or different types. A part of the memory 274 may be a nonvolatile memory while the other part may be a random access memory. A part or the entirety of the memory 274 may be an easily-detachable optical disc or solid-state recording element or may be a cloud-type storage on a net multilayer stack.

The controller 260 is connected with a sensor 276, such as temperature sensor and image sensor. Such a sensor 276 enables detection of the irradiation position of the line beam on the multilayer stack 100 or monitoring of a physical or chemical change in the multilayer stack 100 which can be caused by irradiation.

The controller 260 follows the program stored in the memory 274 and issues appropriate instructions to a laser driving circuit (LD driving circuit) 280 and a transporting device driving circuit 290, when necessary, based on the output of the sensor 276. The LD driving circuit 280 adjusts the irradiation intensity of the line beam emitted from the line beam source 214 according to the instruction from the controller 260. The transporting device driving circuit 290 adjusts the operation of the transporting device 230 according to the instruction from the controller 260.

The transporting device driving circuit 290 controls, for example, the rotation angle and the rotation speed of the motor in order to adjust the mutual positional relationship between the line beam source 214 and the stage 210. In this example, for the sake of simplicity, the line beam source 214 moves in the X-axis direction while the stage 210 is fixed, although the delaminating apparatus of the present embodiment is not limited to this example. The stage 210 may move while the line beam source 214 is fixed. Alternatively, both the stage 210 and the line beam source 214 may move in an identical direction or in different directions. When the stage 210 moves while the stage 210 supports a heavy-weight multilayer stack 100, a bearing such as, for example, air slider can be used.

The line beam source 214 includes a plurality of arranged semiconductor laser devices. Each of the semiconductor laser devices is connected with a laser diode (LD) driving circuit 280. The LD driving circuit 280 receives an electric signal from the above-described photodiode for monitoring and adjusts the optical power of the semiconductor laser device to a predetermined level.

<Semiconductor Laser Device>

Figure 6:
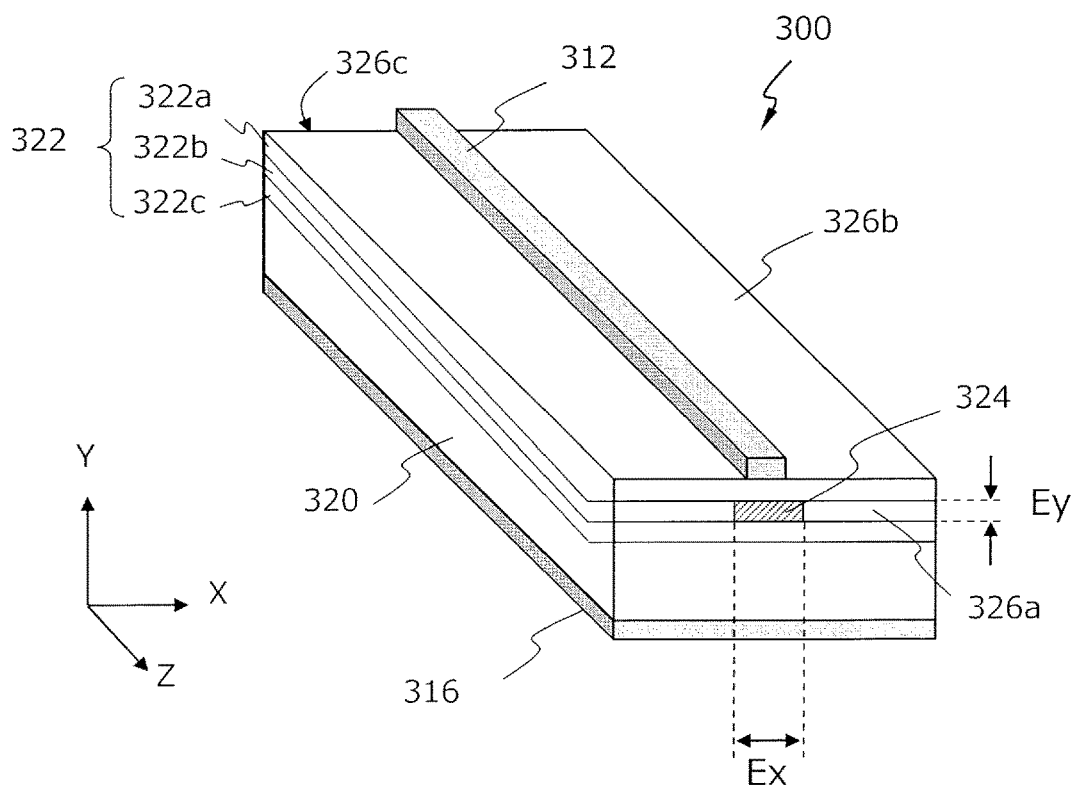
FIG. 6 is a perspective view schematically showing a basic configuration of a semiconductor laser device which can be used in a line beam source.

FIG. 6 is a perspective view schematically showing a basic configuration of a semiconductor laser device which can be used in the line beam source 214. The semiconductor laser device 300 shown in FIG. 6 includes a semiconductor multilayer stack 322 which has a facet 326a. The facet 326a includes an emission region (emitter) 324 from which laser light is to be emitted. In this example, the semiconductor multilayer stack 322 is supported on a semiconductor substrate 320 and includes a p-type cladding layer 322a, an active layer 322b, and an n-type cladding layer 322c. On the upper surface 326b of the semiconductor multilayer stack 322, a p-side electrode 312 in the shape of a stripe is provided. On the rear surface of the semiconductor substrate 320, an n-side electrode 316 is provided. When an electric current which is greater than a threshold flows through a predetermined region of the active layer 322b from the p-side electrode 312 to the n-side electrode 316, laser oscillation occurs. The facet 326a of the semiconductor multilayer stack 322 is covered with an unshown reflective film. Laser light is emitted from the emission region 324 via the reflective film.

In general, a size in the Y-axis direction of the emission region 324, Ey, is smaller than a size in the X-axis direction of the emission region 324, Ex. Thus, laser light emitted from the emission region 324 diverges in the Y-axis direction due to a diffraction effect. According to the embodiment of the present disclosure, formation of a line beam can be realized by utilizing this diffraction effect. Note that an optical element, such as lens, diffraction element, slit, may be provided over the front surface of the emission region 324 for beam reshaping of the laser light.

The semiconductor laser device 300 can be made of various semiconductor materials and can have various configurations and sizes according to the oscillation wavelength and the optical power. When the laser light is required to have a wavelength in the ultraviolet region (e.g., 300-350 nm), the semiconductor multilayer stack 322 of the semiconductor laser device 300 can be suitably made of a nitride semiconductor, such as AlGaN-based semiconductor or InAlGaN-based semiconductor. The oscillation wavelength of the semiconductor laser device 300 can be set within the range of, for example, 200 nm to 350 nm. A ridge stripe may be provided in the p-type cladding layer 322a such that light confinement in the horizontal transverse direction is realized. The active layer 322b may include a single or a plurality of quantum well structures. The semiconductor multilayer stack 322 may include other semiconductor layers, such as a light guiding layer, a buffer layer, and a contact layer. When the substrate 320 is a sapphire substrate, the n-side electrode 316 is provided on a side of the substrate 320 on which the p-side electrode 312 is provided.

The configuration shown in FIG. 6 is merely a typical example of the configuration of the semiconductor laser device 300 and is simplified for the sake of simple description. This simplified configuration example does not limit embodiments of the present disclosure. The line beam can also be formed using a surface-emission type semiconductor laser device. Note that, in the other drawings, constituents such as the n-side electrode 316 will be omitted for the sake of simplicity.

<Configuration Example of Line Beam Source>

Figure 7A:
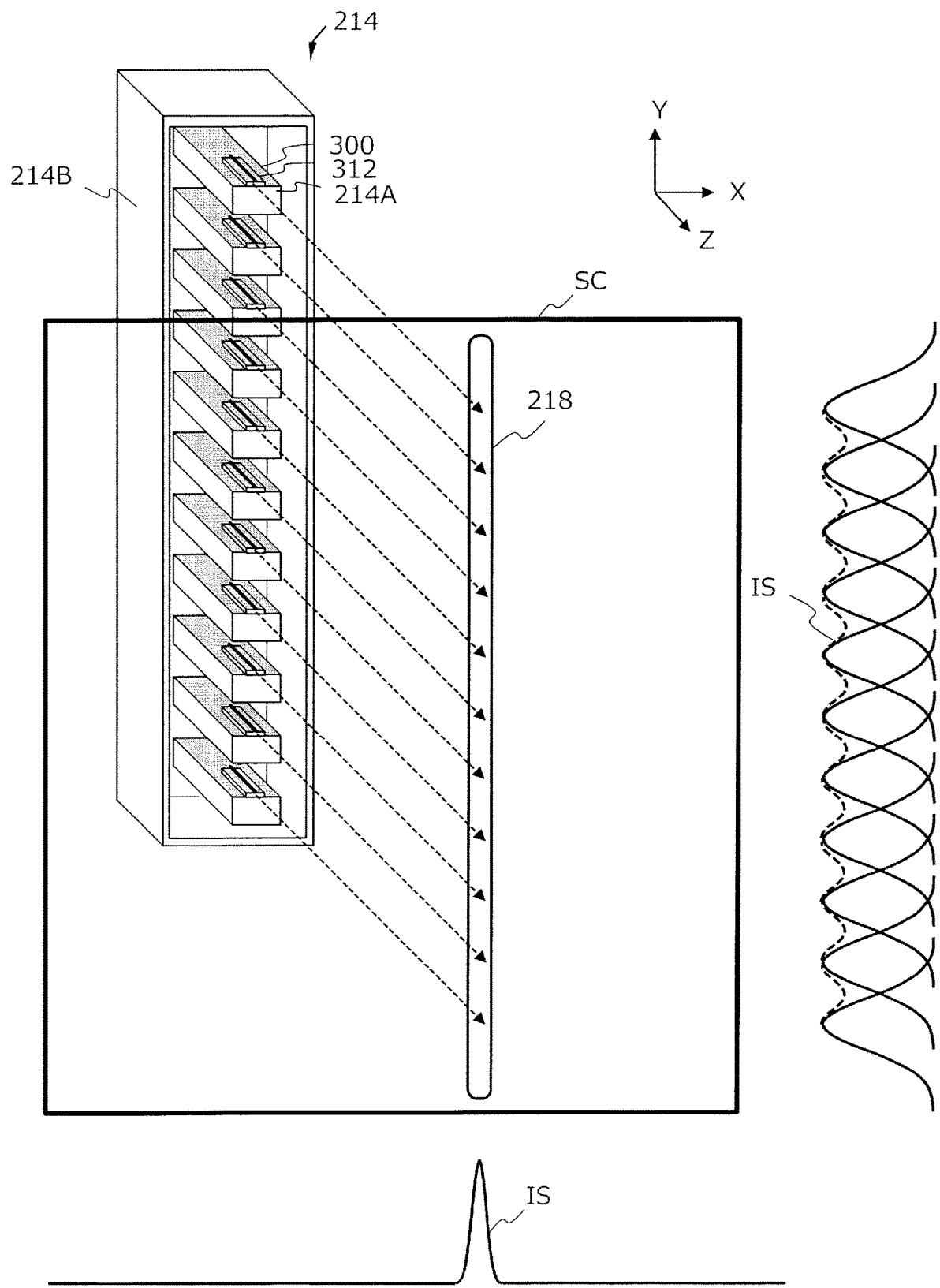
FIG. 7A is a diagram schematically showing a configuration example of a line beam source and an example of the light intensity distribution of laser light emitted from a semiconductor laser device during scanning.

See FIG. 7A. The line beam source 214 includes a plurality of semiconductor laser devices 300 and a plurality of supports 214A supporting the semiconductor laser devices 300. The semiconductor laser devices 300 and the supports 214A are held in a casing 214B. The supports 214A may be suitably made of a good conductor of high thermal conductivity, e.g., a metal such as copper or a ceramic material such as aluminum nitride. The casing 214B is closed with, for example, an unshown light-transmitting cover, whereby the inside of the casing 214B can be shielded from the atmosphere. The inside of the casing 214B is filled with, for example, a gas which is inert with the semiconductor laser devices 300. Each of the semiconductor laser devices 300 is supplied with electric power via an unshown wire (metal wire, metal ribbon, or the like). To suppress increase of the temperature of the semiconductor laser devices 300 during operation, a thermoelectric cooling device (not shown) such as Peltier device may be provided near the semiconductor laser devices 300. The supports 214A may include an internal channel for water cooling and fins for air cooling.

In each of the semiconductor laser devices 300, an unshown photodiode is provided near a facet 326c of the semiconductor laser device 300 which is opposite to the emission-side facet 326a. This facet 326c is covered with a reflective film which has a relatively-high reflectance. However, part of laser light oscillating inside the semiconductor laser device 300 leaks out from the facet 326c. This laser light leakage is detected by the photodiode, whereby the intensity of laser light emitted from the facet 326a can be monitored. The output of the photodiode is used for power control as previously described.

In the example of FIG. 7A, eleven semiconductor laser devices 300 are arranged along an identical line which is parallel to the Y-axis. The number of semiconductor laser devices 300 is not limited to this example but may be not more than ten or may be not less than twelve. To form a long line beam for irradiating a large-area region or to modulate the spatial distribution of the irradiation intensity at high resolution, more than 50 or more than 100 semiconductor laser devices 300 can be arranged on the same line. Each of the semiconductor laser devices 300 can have the same configuration as that of the semiconductor laser device 300 of FIG. 6. Laser light (lift-off light 216) emitted from the emission regions 324 of respective ones of the semiconductor laser devices 300 diverge in parallel to the same line so as to form a line beam.

In FIG. 7A, a rectangular scanned surface SC which is parallel to the XY plane and an irradiation region 218 which is formed by laser light (lift-off light 216) on the scanned surface SC are schematically shown. The scanned surface SC is equivalent to the interface between the plastic film 30 and the glass base 10 in the multilayer stack 100.

For the sake of reference, FIG. 7A shows the X-axis direction distribution and the Y-axis direction distribution of the irradiation intensity IS in the irradiation region 218 at a certain time. The X-axis direction distribution of the irradiation intensity IS is narrow and unimodal. Meanwhile, the Y-axis direction distribution of the irradiation intensity IS has eleven peaks because laser light emitted from respective ones of the eleven semiconductor laser devices 300 overlap one another and extend in the shape of a line.

As previously described, laser light emitted from each of the semiconductor laser devices 300 has a tendency to diverge in a predetermined direction (in this example, Y-axis direction) due to a diffraction effect. This characteristic is suitable to formation of a line beam extending in the Y-axis direction. Meanwhile, an optical element such as cylindrical lens may be used in order to suppress the divergence in the X-axis direction such that the irradiation energy in every second per unit area (irradiation intensity expressed in joule/cm$^2$) is increased. When such an optical element is used to focus the laser light in the X-axis direction, the width (the size in the X-axis direction) of the irradiation region 218 on the scanned surface SC can be narrowed to, for example, about 0.2 mm or smaller.

From the viewpoint of increasing the irradiation intensity of the line beam, it is preferred to decrease the arrangement pitch of the semiconductor laser devices 300 such that the number density of the semiconductor laser devices 300 is increased. For example, 100 or more semiconductor laser devices 300 may be arranged in a straight line at intervals of 1 mm to 5 mm (arrangement pitch: the distance between the centers of adjoining light sources). When the semiconductor laser devices 300 are arranged at such a high density and the distance from the semiconductor laser devices 300 to the scanned surface SC is for example 10 mm, the irradiation intensity can be modulated at a high spatial resolution of, for example, 1 mm to 5 mm. To achieve a high spatial resolution, an optical element which can prevent the cross section of laser light emitted from each of the semiconductor laser devices 300 from diverging (an optical system for collimation or convergence) may be provided on the optical path of the laser light.

Figure 7B:
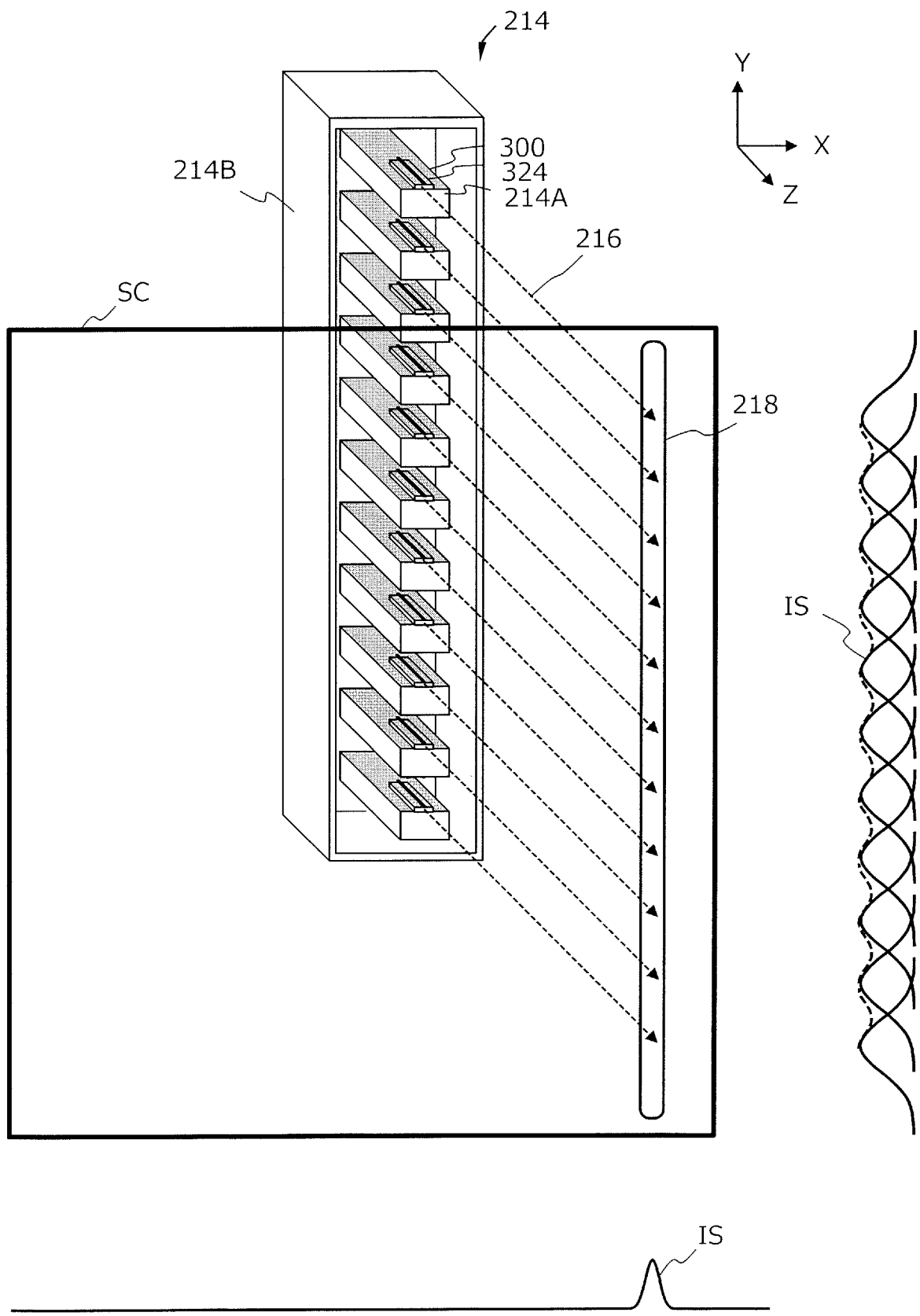
FIG. 7B is a diagram schematically showing a configuration example of a line beam source and another example of the light intensity distribution of laser light emitted from a semiconductor laser device during scanning.

Next, see FIG. 7B. FIG. 7B shows the line beam source 214 translated from the position shown in FIG. 7A in the positive direction of the X-axis. The irradiation region 218 is also translated according to the movement of the line beam source 214. In the state of FIG. 7B, the power of each of the semiconductor laser devices 300 is lower than that in the state of FIG. 7A. It is not necessary to increase or decrease the powers of respective ones of the semiconductor laser devices 300 at the same timing. In other words, not only the X-axis direction distribution of the irradiation intensity IS but also the Y-axis direction distribution can be variously changed during the scanning with the line beam.

By using the thus-arranged plurality of semiconductor laser devices 300, the power of the semiconductor laser devices 300 can be temporally and/or spatially modulated according to the position of the irradiation region 218. Thus, the distribution of the irradiation intensity across the scanned surface SC can be controlled.

Figure 8:
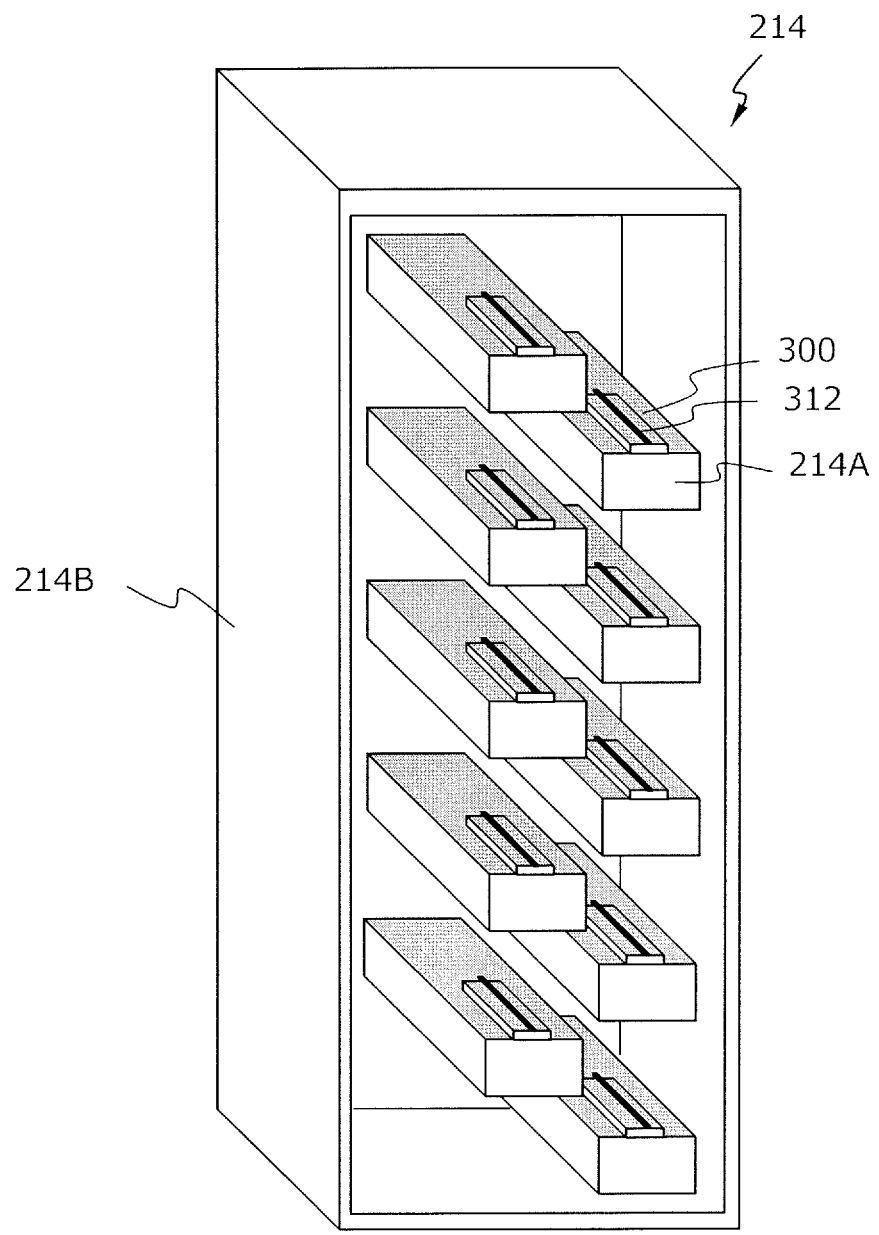
FIG. 8 is a perspective view schematically showing another configuration example of the line beam source.

FIG. 8 is a perspective view schematically showing another configuration example of the line beam source 214 that includes a plurality of semiconductor laser devices 300. In this example, the semiconductor laser devices 300 arranged in two rows have a stagger pattern (staggered arrangement). By reducing the distance between the centers of the two rows, a single line beam can be formed in total. When the orientation of the semiconductor laser devices 300 is adjusted such that the optical axes of the semiconductor laser devices 300 included in the first row and the optical axes of the semiconductor laser devices 300 included in the second row intersect with each other on the multilayer stack 100, substantially a single line beam can be formed.

According to the "line beam source" of the embodiment of the present disclosure, the irradiation region of the lift-off light does not need to be a single line. The irradiation region only needs to be continuously or discontinuously distributed in a direction transverse to the scanning direction. In other words, it is only necessary that the line beam source includes a plurality of light sources arranged along a line. The number of such lines is not limited to being singular but may be two or more.

Figure 9:
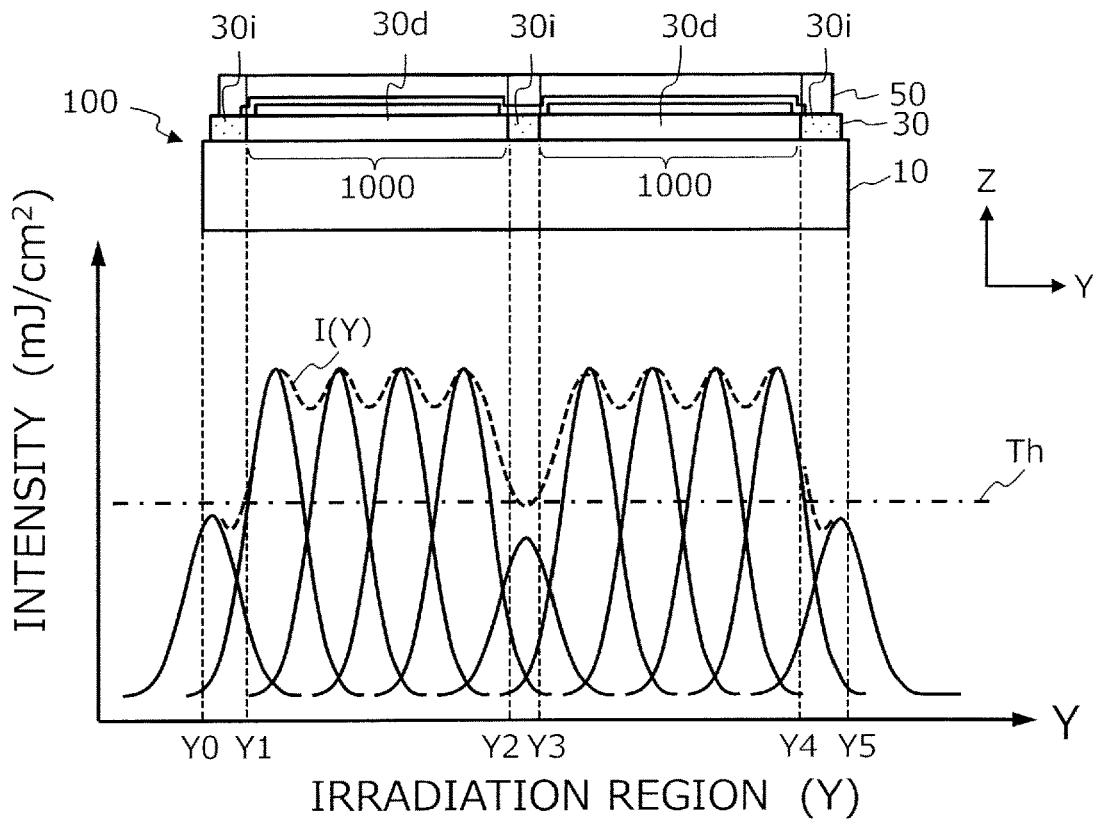
FIG. 9 is a diagram schematically showing an example of the distribution in the Y-axis direction of the irradiation intensity of the lift-off light.

Next, see FIG. 9. FIG. 9 is a diagram schematically showing an example of the distribution in the Y-axis direction of the irradiation intensity of the lift-off light 216. In the graph of FIG. 9, the horizontal axis represents the Y-axis coordinate of the irradiation region, and the vertical axis represents the irradiation intensity. The irradiation intensity is expressed by the energy density per unit area (e.g., [mJ/cm$^2$]). In the graph of FIG. 9, specific numbers of the irradiation intensity are not shown. The irradiation intensity refers to a value in the range of, for example, not less than 0 mJ/cm$^2$ and not more than 500 mJ/cm$^2$.

A curve shown by a broken line in the graph of FIG. 9 represents the distribution in the Y-axis direction of the irradiation intensity, I(Y). The Y-axis direction distribution I(Y) of the irradiation intensity is defined by overlapping of the light intensity distributions of laser light emitted from the plurality of semiconductor laser devices 300 of the line beam source 214 (e.g., FIG. 7A). The light intensity distribution of the laser light emitted from each of the semiconductor laser devices 300 can be reshaped using an optical element such as lens. The light intensity distribution shown in the drawing is merely exemplary. In FIG. 9, a straight dot-chain line represents threshold level Th of the irradiation intensity which is necessary for delamination. Threshold level Th is, for example, 250-300 mJ/cm$^2$. In a region irradiated with lift-off light at an irradiation intensity lower than this threshold level Th, the amount of lift-off light absorbed by the plastic film 30 is insufficient. Therefore, the plastic film 30 in that region remains bound, without being delaminated from the glass base 10.

In FIG. 9, a cross section of the multilayer stack 100 which is parallel to the YZ plane is shown above the graph for reference. The glass base 10 extends from position Y0 to position Y5. The light-emitting device 1000 on the left-hand side resides in the region extending from position Y1 to position Y2. The light-emitting device 1000 on the right-hand side resides in the region extending from position Y3 to position Y4. In other words, the flexible substrate regions 30d of the plastic film 30 correspond to the region extending from position Y1 to position Y2 and the region extending from position Y3 to position Y4. Meanwhile, the intermediate region 30i of the plastic film 30 corresponds to the region extending from position Y0 to position Y1, the region extending from position Y2 to position Y3, and the region extending from position Y4 to position Y5.

In the example of FIG. 9, the irradiation intensity distribution I(Y) of the lift-off light is higher than threshold level Th in the region extending from position Y1 to position Y2 and the region extending from position Y3 to position Y4. In other words, the interface between the flexible substrate regions 30d of the plastic film 30 and the glass base 10 is irradiated with lift-off light whose irradiation intensity exceeds threshold level Th. Meanwhile, each of the region extending from position Y0 to position Y1, the region extending from position Y2 to position Y3, and the region extending from position Y4 to position Y5 includes a portion in which the irradiation intensity distribution I(Y) of the lift-off light is lower than threshold level Th.

The smallest value of the irradiation intensity distribution I(Y) of the lift-off light during the scanning is typically 0 mJ/cm$^2$ but may be greater than 0 mJ/cm$^2$ so long as it is lower than threshold level Th.

When an amorphous semiconductor is heated and crystallized by irradiation with laser light in the shape of a line beam, the irradiation intensity distribution is desired to be uniform in order to achieve uniform crystallinity. On the other hand, when the delamination in the present embodiment is carried out, the irradiation intensity of the line beam does not need to be uniform so long as the irradiation intensity of the lift-off light at the interface which needs delamination exceeds threshold level Th.

Figure 10:
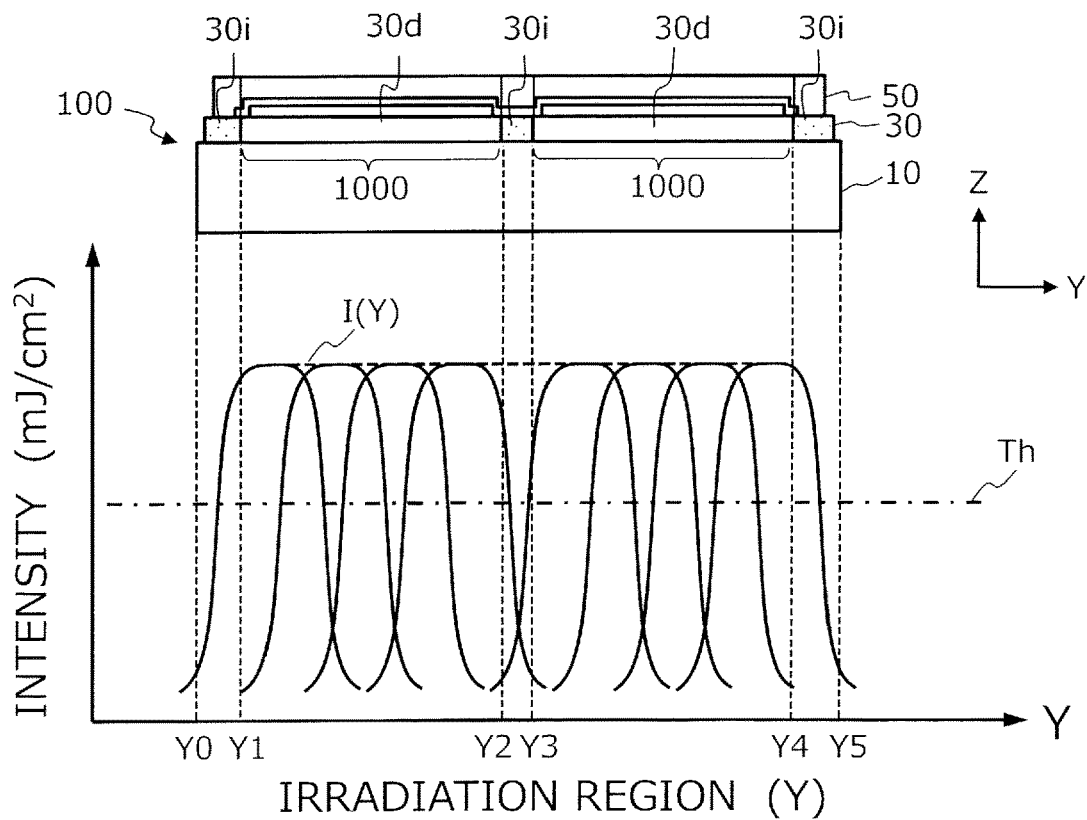
FIG. 10 is a diagram schematically showing another example of the distribution in the Y-axis direction of the irradiation intensity of the lift-off light.

In the example of FIG. 9, the irradiation intensity distribution I(Y) of the lift-off light has many peaks, although the embodiment of the present disclosure is not limited to such an example. For example, as illustrated in FIG. 10, part of the irradiation intensity distribution I(Y) of the lift-off light may be linear. In the example of FIG. 10, the light intensity distribution of laser light emitted from each of the semiconductor laser devices 300 of the line beam source 214 (e.g., FIG. 7A) is flat at the center of its optical axis, i.e., "top hat" type. If the irradiation intensity of the lift-off light at the interface which needs delamination exceeds threshold level Th as described above, the irradiation intensity of the line beam does not need to be uniform. Thus, the optical powers of the plurality of semiconductor laser devices 300 may be different from one another.

According to the present embodiment, in the irradiation intensity distribution I(Y), the irradiation intensity of laser light for the interface between the intermediate region 30i of the plastic film 30 and the glass base 10 is lower than the irradiation intensity of laser light for the interface between the flexible substrate regions 30d of the plastic film 30 and the glass base 10.

Figure 11:
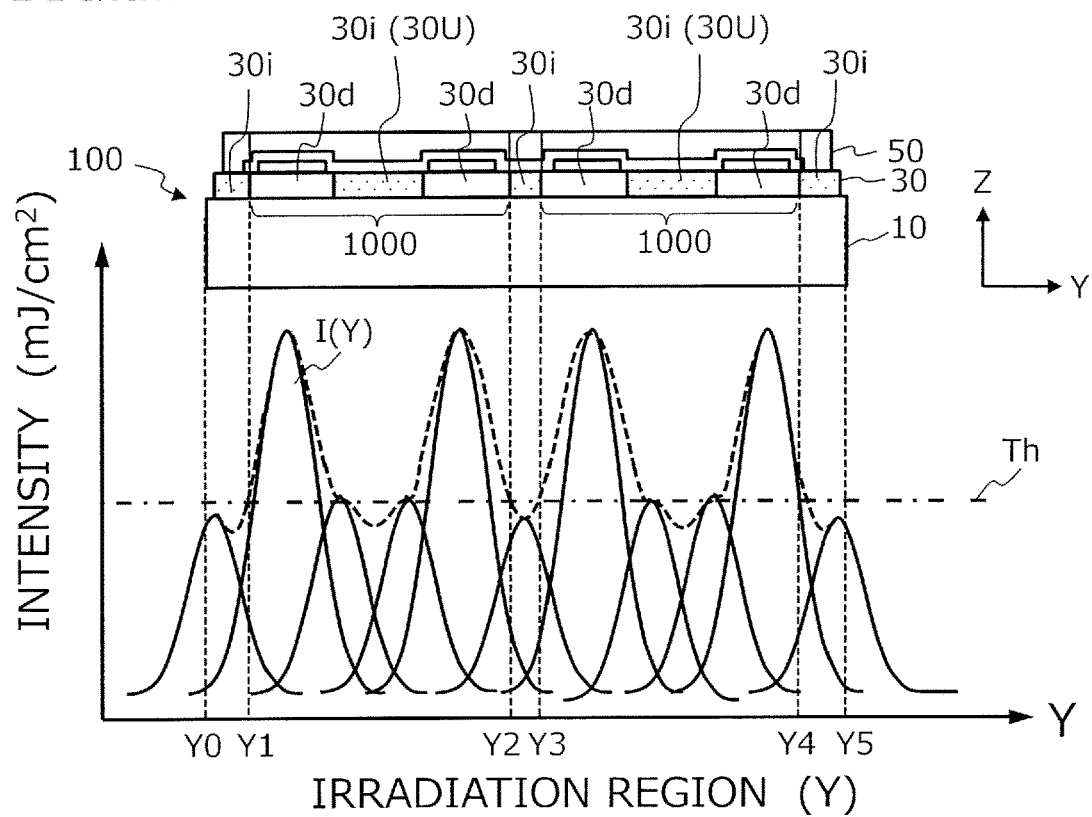
FIG. 11 is a diagram schematically showing still another example of the distribution in the Y-axis direction of the irradiation intensity of the lift-off light.

FIG. 11 shows an example of the Y-axis direction distribution I(Y) in a cross section which is different from the Y-axis direction distribution I(Y) shown in FIG. 9. This cross section extends across the protrusions 30V and the cutout 30U of the flexible substrate regions 30d shown in FIG. 1C.

In the cross section shown in FIG. 11, the center of each of two light-emitting devices 1000 includes a portion which is to be bound to the glass base 10, without being delaminated together with the intermediate region 30i of the plastic film 30 from the glass base 10.

In the example of FIG. 11, the power of some of the semiconductor laser devices that are constituents of the line beam source 214 is decreased, whereby the Y-axis direction distribution I(Y) is made locally lower than threshold level Th at the interface between the intermediate region 30i of the plastic film 30 and the glass base 10. Of a portion in which the irradiation intensity is lower than threshold level Th, a part corresponding to the cutout 30U of the flexible substrate region 30d forms a "large-width portion" in the striped "low irradiation region".

Figure 12:
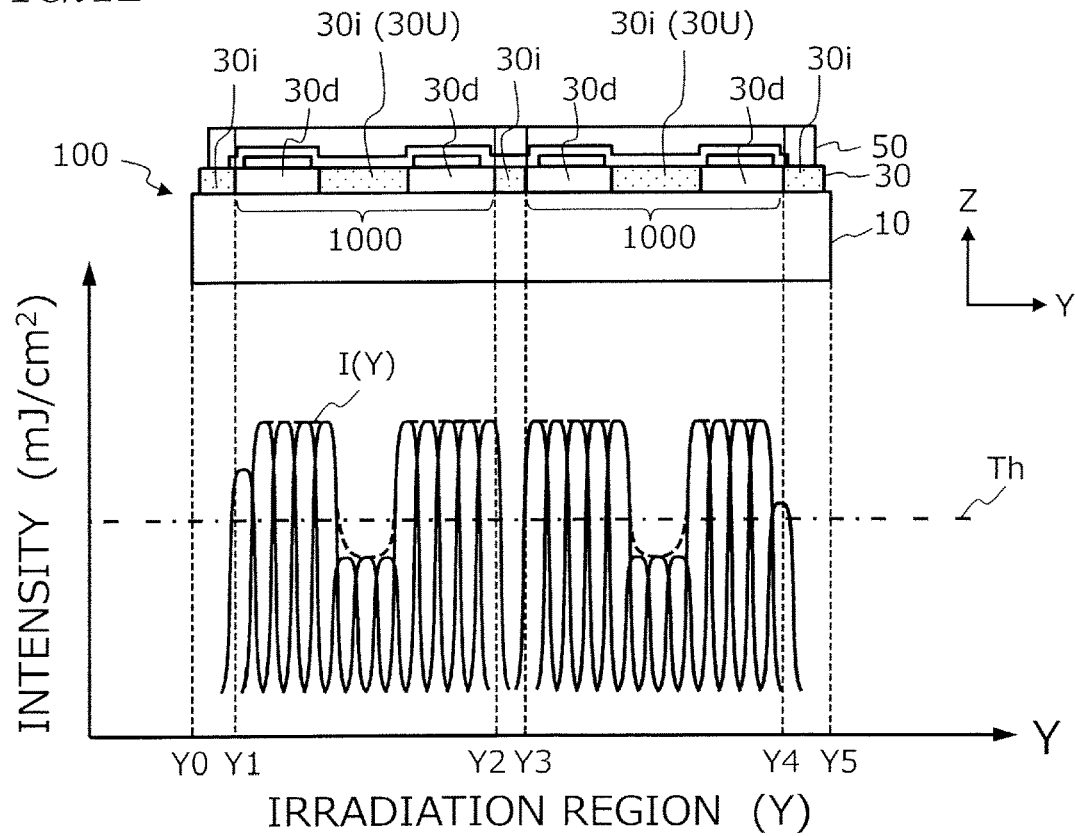
FIG. 12 is a diagram schematically showing still another example of the distribution in the Y-axis direction of the irradiation intensity of the lift-off light.

FIG. 12 shows another example of the Y-axis direction distribution I(Y) in the same cross section as that of FIG. 11. The Y-axis direction distribution I(Y) of FIG. 12 can be realized by a line beam source 214 which includes 27 or more aligned semiconductor laser devices. In this example, laser light emitted from each semiconductor laser device can realize a Y-axis direction distribution I(Y) which changes at a higher spatial resolution than in the example of FIG. 11. Note that at the interface between the intermediate region 30i of the plastic film 30 and the glass base 10, the irradiation intensity may be zero.

According to the embodiment of the present disclosure, the line beam source 214 includes a plurality of laser light sources, and therefore, the irradiation intensity in the line beam can be spatially and temporally modulated by adjusting the power of each laser light source. Thus, a spatial distribution of the irradiation intensity which accords with the shape, size and arrangement of the light-emitting devices 1000 included in the multilayer stack 100 can be easily realized. More specifically, the spatial distribution of the irradiation intensity in the line beam is temporally changed during scanning such that the flexible substrate regions 30d which have a shape such as shown in, for example, FIG. 1C or FIG. 1D can be irradiated with lift-off light at an irradiation intensity which is necessary for delamination while the intermediate region 30i of the plastic film 30 can be irradiated with lift-off light at an irradiation intensity which would not cause delamination. If the type or design of the multilayer stack 100 to be produced is changed, the distribution of the irradiation intensity can be flexibly modulated.

The region in which the irradiation intensity of the lift-off light is lower than a level necessary for delamination does not need to include the entirety of the intermediate region 30i of the plastic film 30. The entirety of the unnecessary portions of the multilayer stack 100 can be left on the glass base 10 so long as part of the intermediate region 30i of the plastic film 30 is bound to the glass base 10. According to the embodiment of the present disclosure, the unnecessary portions of the multilayer stack 100 can be left on the glass base 10 in a wide range which accords with its shape.

A typical example of the laser light source is a semiconductor laser device, although the embodiment of the present disclosure is not limited to this example. When a semiconductor laser device is used, a small size, lightweight line beam source can advantageously be realized. However, when the multilayer stack 100 is moved during the scanning, each of a plurality of laser light sources may be a large laser apparatus as compared with the semiconductor laser device. When the oscillation wavelength of the laser light source is out of a range suitable for delamination of the plastic film, the laser light may be converted to a harmonic wave using a wavelength converter.

Figure 13:
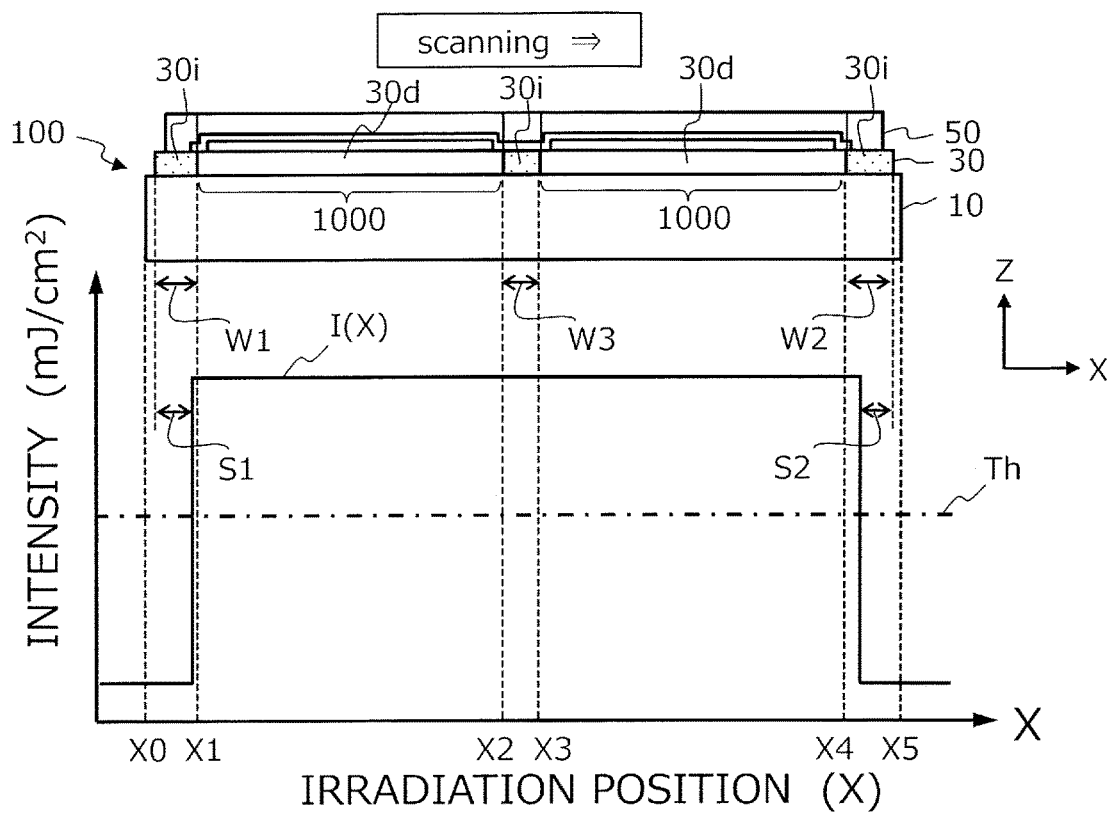
FIG. 13 is a diagram schematically showing an example of the distribution in the X-axis direction (scanning direction) of the irradiation intensity of the lift-off light.

Next, see FIG. 13. FIG. 13 is a diagram schematically showing an example of the distribution in the X-axis direction (scanning direction) of the irradiation intensity of the lift-off light 216. In the graph of FIG. 13, the horizontal axis represents the X-axis coordinate of the irradiation position, and the vertical axis represents the irradiation intensity. In the graph of FIG. 13, the solid line represents the X-axis direction distribution I(X) of the irradiation intensity, and a straight dot-chain line represents threshold level Th of the irradiation intensity which is necessary for delamination.

In FIG. 13, a cross section of the multilayer stack 100 which is parallel to the XZ plane is shown above the graph for reference. This cross section is perpendicular to the cross section of FIG. 9. The glass base 10 extends from position X0 to position X5. The light-emitting device 1000 on the left-hand side in the drawing resides in the region extending from position X1 to position X2. The light-emitting device 1000 on the right-hand side resides in the region extending from position X3 to position X4. In other words, the flexible substrate regions 30d of the plastic film 30 correspond to the region extending from position X1 to position X2 and the region extending from position X3 to position X4. Meanwhile, the intermediate region 30i of the plastic film 30 corresponds to the region extending from position X0 to position X1 (width: W1), the region extending from position X2 to position X3 (width: W3), and the region extending from position X4 to position X5 (width: W2). The intermediate region 30i at the left edge of the plastic film 30 in FIG. 13 (width: W1) includes a region in which the irradiation intensity is lower than threshold level Th (width: S1). Meanwhile, the intermediate region 30i at the right edge of the plastic film 30 in FIG. 13 (width: W2) includes a region in which the irradiation intensity is lower than threshold level Th (width: S2). Here, W1>S1 and W2>S2 hold. It is preferred that width S1 is not less than 50% of width W1 and width S2 is not less than 50% of width W2.

The X-axis direction distribution I(X) of the irradiation intensity represents the whole scanning (sum or integral value) of the lift-off light. For example, while the irradiation position of the lift-off light (the position of the center line of the line beam) moves from position X0 to position X5, the region extending from position X4 to position X5 is not irradiated with the lift-off light. In this period, the irradiation intensity of the lift-off light in the region extending from position X4 to position X5 is, as a matter of course, zero.

The line width (the transverse axis dimension, the size in the X-axis direction) of the lift-off light 216 can be, for example, about 0.2 mm. This dimension defines the largeness of the irradiation region at the interface between the plastic film 30 and the glass base 10 at a certain time. The lift-off light 216 can be emitted in the form of a pulsed or continuous wave. Irradiation with the pulsed wave can be carried out at the frequency (the number of shots in one second) of, for example, about 200 times per second. When the lift-off light 216 is a pulsed wave, the scanning speed is determined such that two consecutive shots form partially-overlapping irradiation regions. If, for example, the line width (the transverse axis dimension, the size in the X-axis direction) of the lift-off light 216 is 0.2 mm and the irradiation position moves at 20 mm per second in the X-axis direction, a gap can occur between neighboring shots so long as the number of shots per second is less than 100. Therefore, the number of shots per second needs to exceed 100.

The positioning accuracy of the irradiation position depends on the mechanical forwarding accuracy of the line beam source 214. When the line width (the transverse axis dimension, the size in the X-axis direction) of the lift-off light 216 is, for example, 40 μm, moving the line beam source 214 stepwise at intervals of 20 μm can set the overlap of irradiation regions formed by two consecutive shots to 50%. Moving the line beam source 214 stepwise at intervals of 30 μm can set the overlap of irradiation regions formed by two consecutive shots to 75%. By controlling the overlap of irradiation regions, the irradiation intensity can also be changed without modulating the power of the laser light source.

When the irradiation position of the lift-off light is forwarded stepwise, "stepwise movement of the line beam source 214" and "pulsed irradiation with the lift-off light" can be repeated. In this case, irradiation with the lift-off light can be carried out while movement of the line beam source 214 relative to the stage 210 is stopped. In irradiation of a stationary object with laser light, adjustment of the irradiation intensity to a target value is easier than in irradiation of a moving object with laser light. For example, the irradiation intensity can be adjusted by, for example, increasing or decreasing the number of irradiation pulses or the irradiation duration at a stationary position. According to the embodiment of the present disclosure, a semiconductor laser device is used for the light source, and therefore, advantageously, the irradiation intensity can be easily controlled by adjusting the oscillation state of the semiconductor laser device.

When the moving speed (scanning speed) of the irradiation position is fixed to a predetermined value, the irradiation intensity can be modulated by increasing or decreasing the number of shots per second. On the contrary, when the number of shots per second is fixed, the irradiation intensity can be modulated by increasing or decreasing the moving speed (scanning speed) of the irradiation position. The irradiation intensity can also be modulated by changing the other parameters, e.g., the optical distance from the line beam source 214 to the multilayer stack 100. Also, a low irradiation region can be formed by providing a mechanical shutter between the line beam source 214 and the glass base 10 such that this shutter blocks the optical path of the lift-off light.

As seen from FIG. 13, in this example, the irradiation intensity of lift-off light for at least part of the interface between the intermediate region 30i of the plastic film 30 and the glass base 10 is lower than the irradiation intensity of lift-off light for the interface between the flexible substrate regions 30d of the plastic film 30 and the glass base 10. The region of this "at least part" may be referred to as "low irradiation region" or "non-delamination region". In the example of FIG. 13, the low irradiation region includes two parallel stripe regions extending along the perimeter of the glass base 10 (a region of width S1 and a region of width S2). The two stripe regions can be formed by irradiation with weak lift-off light 216 shown in FIG. 5A and FIG. 5D. In these two stripe regions, the irradiation intensity of the lift-off light 216 is lower than threshold level Th, and therefore, the intermediate region 30i of the plastic film 30 remains bound to the glass base 10.

As previously described with reference to FIG. 9 and FIG. 11, in the embodiment of the present disclosure, the distribution in the Y-axis direction of the irradiation intensity is changed while the irradiation position of the lift-off light is moved along the X-axis (during scanning). Thus, any of the stripe regions which define the "low irradiation region" can include a large-width portion and/or narrow-width portion which accords with the intermediate region 30i of the plastic film 30. By thus making the shape and size of the "low irradiation region" conformable to those of the intermediate region 30i of the plastic film 30, the degree of adhesion between the intermediate region 30i of the plastic film 30 and the glass base 10 can be improved as a whole. It is not desired that the "low irradiation region" extends beyond the intermediate region 30i of the plastic film 30 into the flexible substrate regions 30d.

Figure 14:
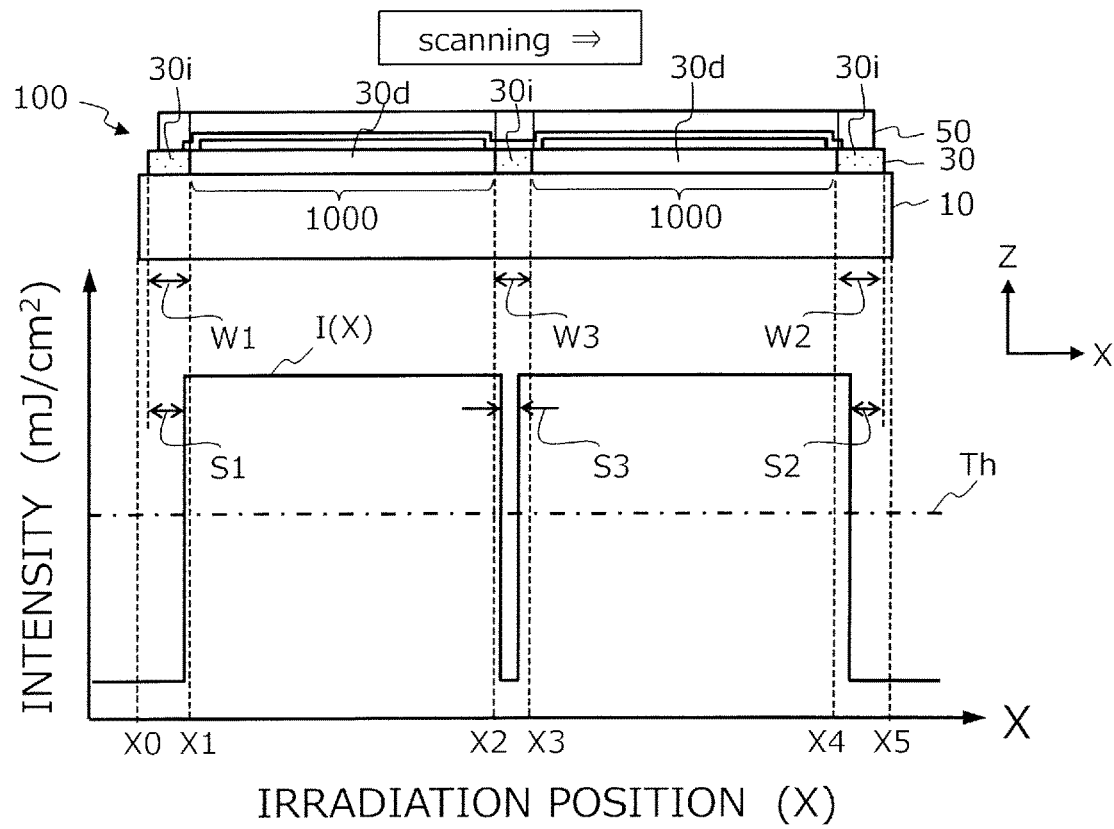
FIG. 14 is a diagram schematically showing another example of the distribution in the X-axis direction of the irradiation intensity of the lift-off light.

FIG. 14 shows an example where the irradiation intensity is temporarily lower than threshold level Th in the middle of the scanning with the lift-off light 216. Specifically, the irradiation intensity is lower than threshold level Th in part of the region extending from position X2 to position X3 (width: S3). In this example, the "low irradiation region" at the interface between the intermediate region 30i of the plastic film 30 and the glass base 10 includes not only the two stripe regions but also a single middle stripe region (width: S3) which is parallel to the two stripe regions. Each of widths S1, S2, S3 of these stripe regions is, for example, not less than 1 mm and, in a certain example, not less than 3 mm.

In the examples of FIG. 13 and FIG. 14, two light-emitting devices 1000 are arranged in the direction of the X-axis. When N is an integer not less than 3 and N light-emitting devices 1000 are arranged in the direction of the X-axis, the total number of stripes formed by the intermediate region 30i lying between two adjoining light-emitting devices 1000 is N−1. It is not necessary to provide a low irradiation region in all of the N−1 stripes. Alternatively, a plurality of low irradiation regions may be provided for an intermediate region 30i which forms a single stripe.

Figure 15A:
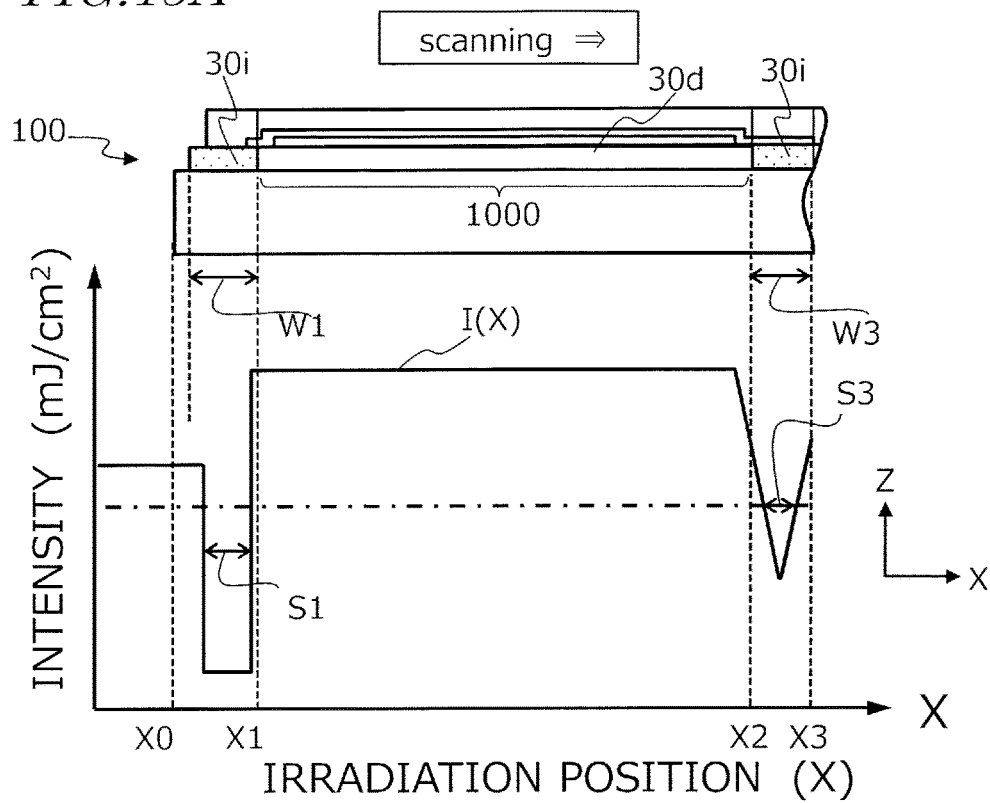
FIG. 15A is a diagram schematically showing still another example of the distribution in the X-axis direction of the irradiation intensity of the lift-off light.
Figure 15B:
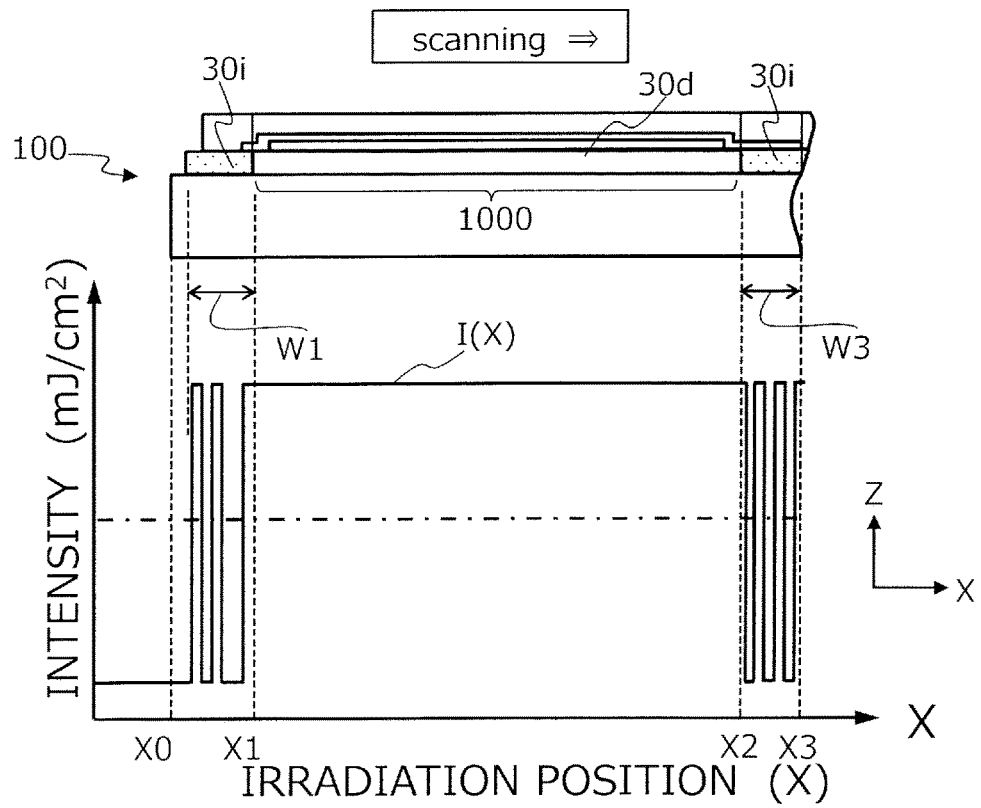
FIG. 15B is a diagram schematically showing still another example of the distribution in the X-axis direction of the irradiation intensity of the lift-off light.

In the examples of FIG. 13 and FIG. 14, the low irradiation region of width S1 and the low irradiation region of width S2 each reach the perimeter of the plastic film 30, although the embodiment of the present disclosure is not limited to this example. For example, the low irradiation region can be in various forms as shown in FIG. 15A and FIG. 15B. FIG. 15A and FIG. 15B are diagrams schematically showing still other examples of the distribution in the X-axis direction of the irradiation intensity of the lift-off light. In these drawings, examples of the modulation pattern of the irradiation intensity at the interface between the intermediate region 30i surrounding the light-emitting device 1000 on the left-hand side of FIG. 13 and the glass base 10 are shown.

In the example shown in FIG. 15A, the striped low irradiation regions (width: S1) extending along the perimeter of the plastic film 30 do not reach the perimeter of the plastic film 30. The irradiation intensity of the lift-off light may exceed threshold level Th before the glass base 10 is irradiated with the lift-off light. As in the region extending from position X1 to position X3 shown in FIG. 15A, the irradiation intensity may gradually change. When the irradiation intensity gradually changes, the width (the size in the scanning direction) of the "low irradiation region" can be defined as the width of a region in which the irradiation intensity is lower than threshold level Th.

In the example shown in FIG. 15B, the low irradiation region consists of a plurality of stripes which have a relatively narrow width. When the lift-off light is, for example, pulsed light, such a low irradiation region can be realized by applying consecutive shots such that irradiation regions do not overlap each other.

To maintaining at least part of the intermediate region 30$i$ of the plastic film 30 bound to the glass base 10 by relatively decreasing the irradiation intensity, it is desirable that the irradiation intensity in the "at least part" is lower than threshold level Th. However, even if it is not lower than threshold level Th, the intermediate region 30$i$ is likely to remain on the glass base 10 so long as an irradiation intensity which is lower than the irradiation intensity in a region to be delaminated is realized. If the difference between the irradiation intensity in a region to be delaminated and the irradiation intensity in the low irradiation region is not less than 50 mJ/cm$^2$, a sufficient effect is achieved.

In the present embodiment, the lift-off light is a line beam extending in a direction parallel to the perimeter of the glass base 10 (first direction), and the scanning direction is the second direction which is perpendicular to the first direction. However, the first direction and the second direction do not need to be perpendicular to each other but only need to be transverse to each other.

In the above-described example, as previously described with reference to FIG. 4, the position of the line beam source 214 is moved while the stage 210 is fixed, whereby the irradiation position of the lift-off light is moved (scanning). However, the embodiment of the present invention is not limited to this example. Scanning with the lift-off light may be carried out by moving the stage 210 while the line beam source 214 is fixed. Alternatively, scanning with the lift-off light may be carried out by moving both the line beam source 214 and the stage 210.

<Lift-Off Light Irradiation Unit 2>

In the above-described embodiment, the plurality of light sources included in the lift-off light irradiation unit are a plurality of semiconductor laser devices, although the lift-off light irradiation unit of the present disclosure is not limited to this example. The lift-off light may be radiated from an incoherent light source instead of a coherent light source such as laser light source. In the example described in the following paragraphs, the interface between the plastic film and the glass base is irradiated with lift-off light radiated from a plurality of light emitting diode devices.

As the light source for radiating the lift-off light, light emitting diode devices are available at a lower cost than semiconductor laser devices, and designing and operation of the apparatus are easier from the viewpoint of eye-safety. Light emitting diode (UV-LED) devices which are capable of radiating ultraviolet light have the size of, for example, 3.5 mm (longitudinal)×3.5 mm (transverse)×1.2 mm (thickness). The plurality of light emitting diode devices can be arrayed in a single line or in a plurality of lines. Also in this case, when a plurality of light emitting diode devices are arrayed, the delaminating apparatus is applicable to G8-size substrates (2400 mm×2200 mm) or huge substrates of still larger sizes, to which conventional delaminating apparatuses are not applicable.

The emission intensity of the light-emitting diode device is also controlled by adjusting the magnitude of the driving current as in the above-described semiconductor laser devices. Therefore, in a one-dimensional or two-dimensional array of light emitting diode devices, by modulating the driving current flowing through each of the light emitting diode devices, the irradiation intensity of the lift-off light can be temporally and/or spatially modulated.

The array pitch of the light emitting diode devices is in the range of, for example, not less than 3 mm and not more than 10 mm. The light radiated from the light emitting diode devices is incoherent (non-coherent) light, which is different from laser light. The wavelength of the light radiated from the light emitting diode devices is in the range of, for example, not less than 300 nm and not more than 380 nm. The irradiation energy of the lift-off light radiated from each of the plurality of arrayed light emitting diode devices is in the range of not less than 100 mJ/cm$^2$ and not more than 300 mJ/cm$^2$.

Light radiated from each of the light emitting diode devices diverges around the Z-axis direction at the center. This light represents the distribution (directivity) of the relative radiation intensity which depends on the radiation angle θ that is the gradient from the Z-axis. In one example, the relative radiation intensity of the light emitting diode devices can be about 75% at θ=45°, and about 50% at θ=65°. The directivity of the light emitting diode devices can be adjusted by providing a lens and/or reflector.

Commercially-available light emitting diode devices are capable of radiating ultraviolet light at 365 nm with the power of 1450 milliwatts on the driving conditions that, for example, the electric voltage is 3.85 volts and the electric current is 1000 milliamperes.

An example of a line beam light source in which a plurality of light emitting diode devices are arrayed is described with reference to FIG. 27A, FIG. 27B and FIG. 27C.

Figure 27A:
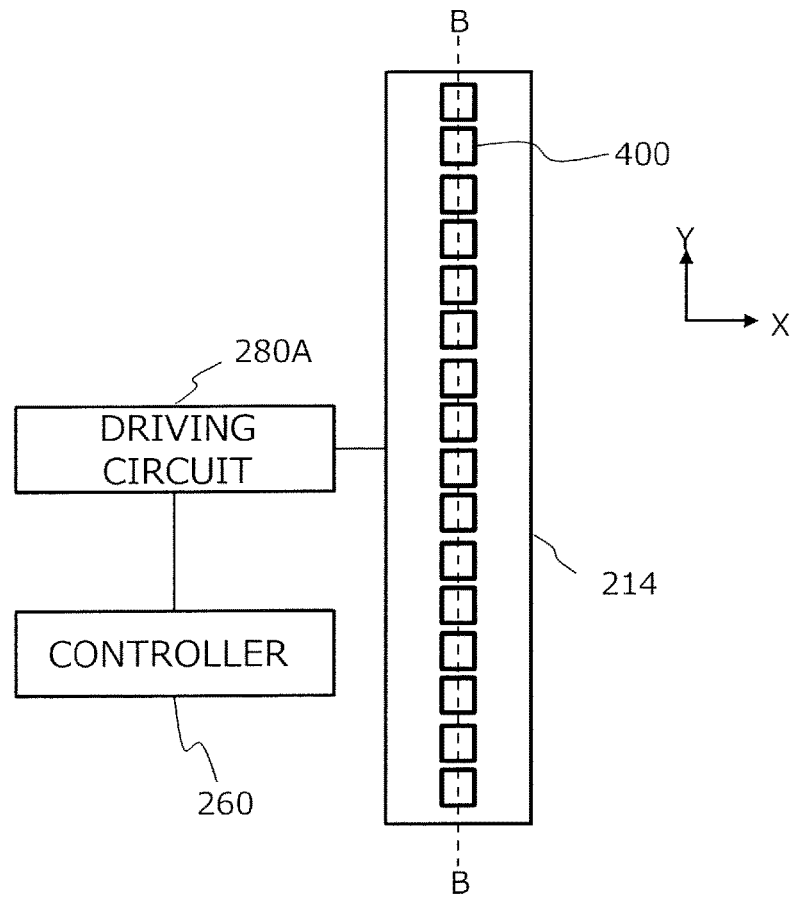
FIG. 27A is a diagram schematically showing the upper surface of a line beam source 214 which includes a single column of light emitting diode devices arrayed in Y-axis direction.
Figure 27B:
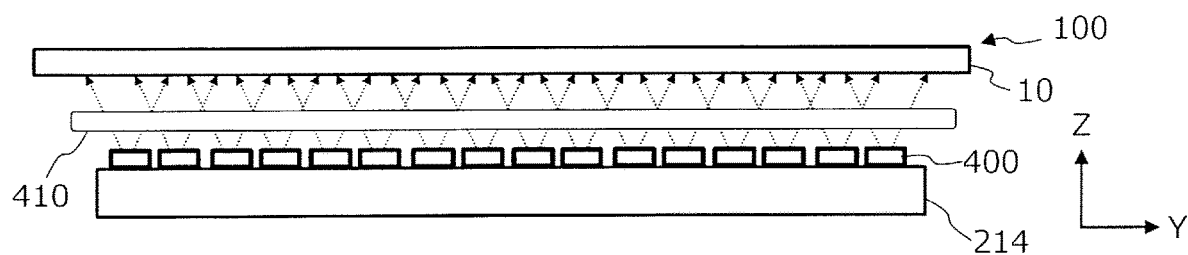
FIG. 27B is a cross-sectional view of the line beam source shown in FIG. 22A taken along line B-B.

FIG. 27A schematically shows the upper surface of a line beam light source 214 which includes a plurality of light emitting diode devices 400 arrayed in Y-axis direction. FIG. 27B is a cross-sectional view of the line beam light source 214 shown in FIG. 27A taken along line B-B. FIG. 27B also shows a multilayer stack 100. FIG. 27C is a diagram showing the moving direction of the line beam light source 214 relative to the multilayer stack 100.

As shown in FIG. 27A, the line beam light source 214 can be coupled with a driving circuit 280A. The driving circuit 280A can modulate the magnitude of the electric current flowing through each of the light emitting diode devices 400. The driving circuit 280A can be coupled with a controller 260. The controller 260 controls the operation of the driving circuit 280A, thereby temporally and/or spatially modulating the irradiation intensity of the lift-off light radiated from the line beam light source 214.

In this example, the ultraviolet light radiated from the light emitting diode devices 400 travels through a cylindrical lens 410 and enters the glass base 10 of the multilayer stack 100 in order to increase the irradiation energy per unit area (irradiation intensity expressed in joule/cm$^2$). Since the ultraviolet light is focused in X-axis direction, the width (the size in X-axis direction) of the irradiation region in the interface at which delamination is to occur (delamination plane) can be decreased to, for example, about 0.2 mm or smaller. Since the cylindrical lens 410 does not focus the light in X-axis direction, the size in Y-axis direction of the irradiation region is not shortened.

The irradiation intensity of the lift-off light can be increased by decreasing the array pitch of the light emitting diode devices 400 such that the number density of the light emitting diode devices 400 increases. For example, when each of the light emitting diode devices 400 has the above-described size, several tens of light emitting diode devices 400 or 100 or more light emitting diode devices 400 may be arrayed with the intervals of 3.5 mm to 10 mm (array pitch: the distance between the centers of adjoining light sources). When smaller light emitting diode devices 400 are used, they can be arrayed with the intervals of, for example, 2 mm to 10 mm. The array pitch of the light emitting diode devices 400 is preferably not more than 5 mm.

When light emitting diode devices 400 of high directivity are arrayed at a high density and the distance from the light emitting diode devices 400 to the delamination plane is, for example, 1.5-5 mm, the irradiation intensity can be modulated at the spatial resolution of 2 mm to 10 mm even without an optical element such as cylindrical lens.

Figure 27C:
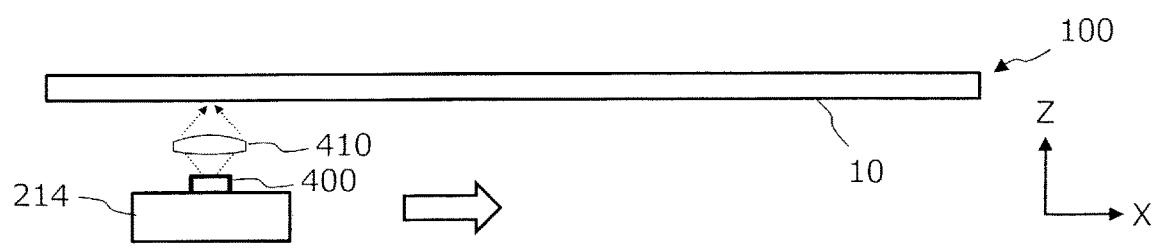
FIG. 27C is a diagram showing the moving direction of the line beam source relative to the multilayer stack 100.

The electric current flowing through each of the light emitting diode devices is modulated while the line beam light source 214 is moved relative to the multilayer stack 100 as shown in FIG. 27C. As a result, lift-off light irradiation can be realized in the same way as the embodiment with the use of the line beam light source 214 which includes a plurality of arrayed semiconductor laser devices 300.

To increase the spatial resolution of the line beam light source 214, the light emitting diode devices 400 may be arrayed in a plurality of columns.

Figure 28A:
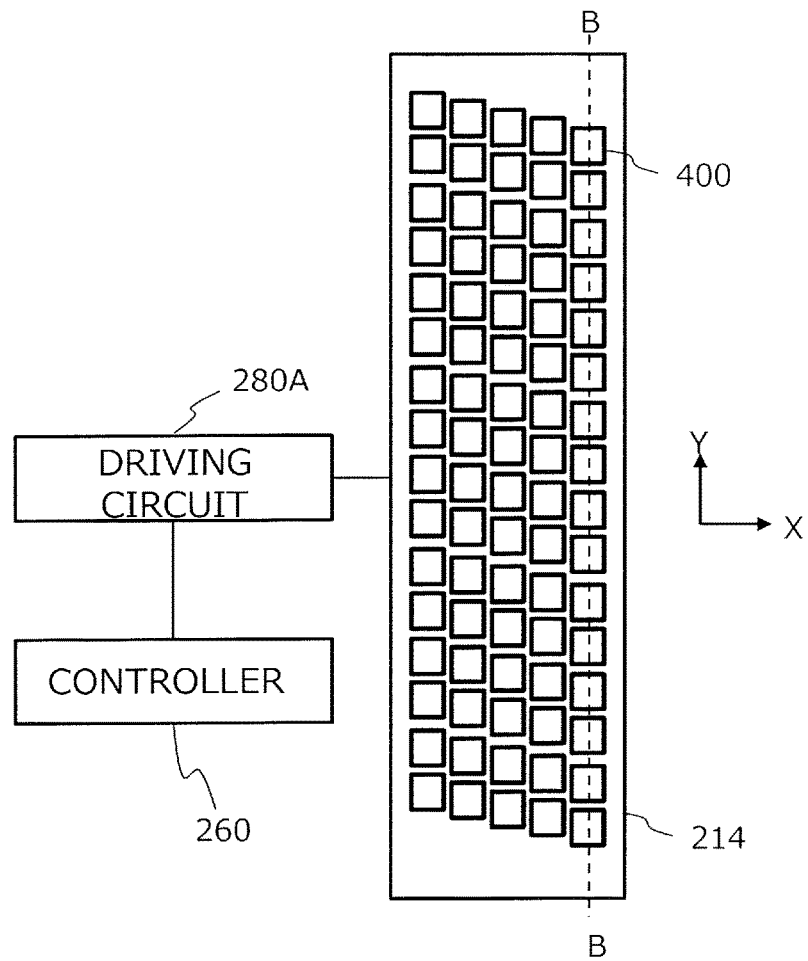
FIG. 28A is a diagram schematically showing the upper surface of a line beam source 214 which includes a plurality of columns of light emitting diode devices arrayed in Y-axis direction.
Figure 28B:
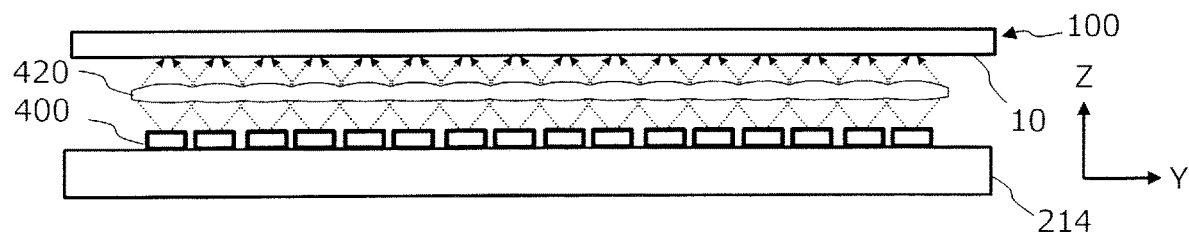
FIG. 28B is a cross-sectional view of the line beam source shown in FIG. 28A taken along line B-B.
Figure 28C:
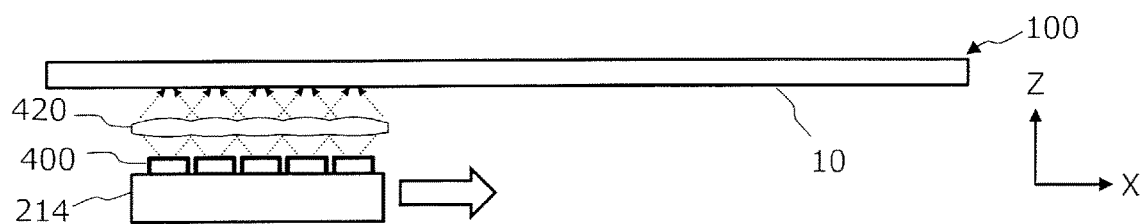
FIG. 28C is a diagram showing the moving direction of the line beam source relative to the multilayer stack.

FIG. 28A schematically shows the upper surface of the line beam light source 214 which includes a plurality of columns of light emitting diode devices 400 arrayed in Y-axis direction. FIG. 28B is a cross-sectional view of the line beam light source 214 shown in FIG. 28A taken along line B-B. FIG. 28B also shows the multilayer stack 100. FIG. 28C is a diagram showing the moving direction of the line beam light source 214 relative to the multilayer stack 100.

This line beam light source 214 can also be coupled with the driving circuit 280A. The controller 260 controls the operation of the driving circuit 280A, thereby temporally and/or spatially modulating the lift-off light radiated from the line beam light source 214.

In this example, the line beam light source 214 includes five columns of light emitting diode devices 400 each extending in Y-axis direction. The positions in Y-axis direction of the five columns of light emitting diode devices 400 are different from one another. The positions of the light emitting diode columns are shifted by P/5 in Y-axis direction between adjoining columns where P is the array pitch.

This line beam light source 214 includes a lens sheet 420 for converging light such that one side of the irradiation region formed by each of the light emitting diode devices 400 has the length of about P/5. Ultraviolet light transmitted through the lens sheet 420 can form irradiation regions in the form of dots over the delamination plane.

As shown in FIG. 28C, when the line beam light source 214 is moved relative to the multilayer stack 100, a plurality of irradiation regions overlap so that the entire delamination plane can be irradiated with the ultraviolet light. By modulating the electric current flowing through each of the light emitting diode devices while the line beam light source 214 is moved relative to the multilayer stack 100, spatial and temporal modulation can be carried out.

Figure 28D:
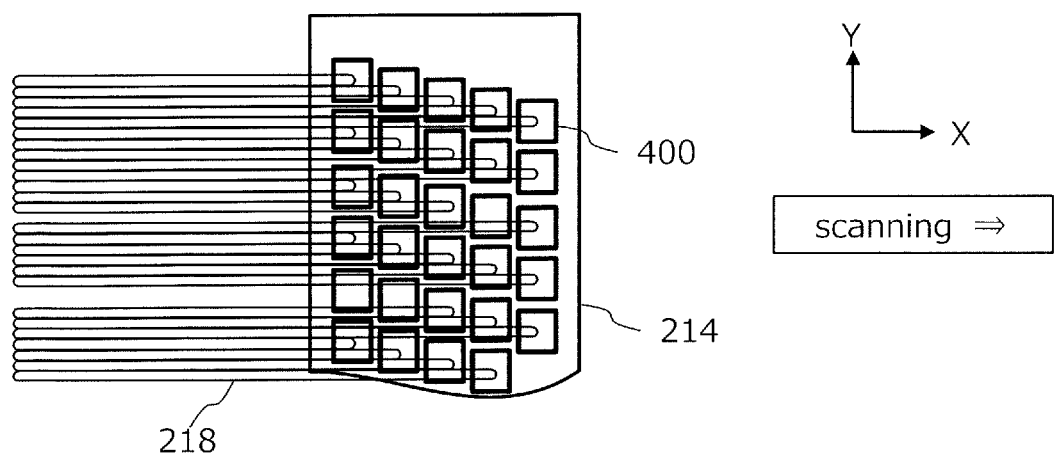
FIG. 28D is a plan view schematically showing irradiation regions the line beam source of FIG. 28A is forming.

FIG. 28D is a diagram schematically showing irradiation regions 218 the line beam source 214 of FIG. 28A is forming. By turning off some of the light emitting diode devices 400 during scanning by the line beam light source 214, non-irradiation regions whose width is smaller than the size of the light emitting diode devices 400 can be formed.

Figure 28E:
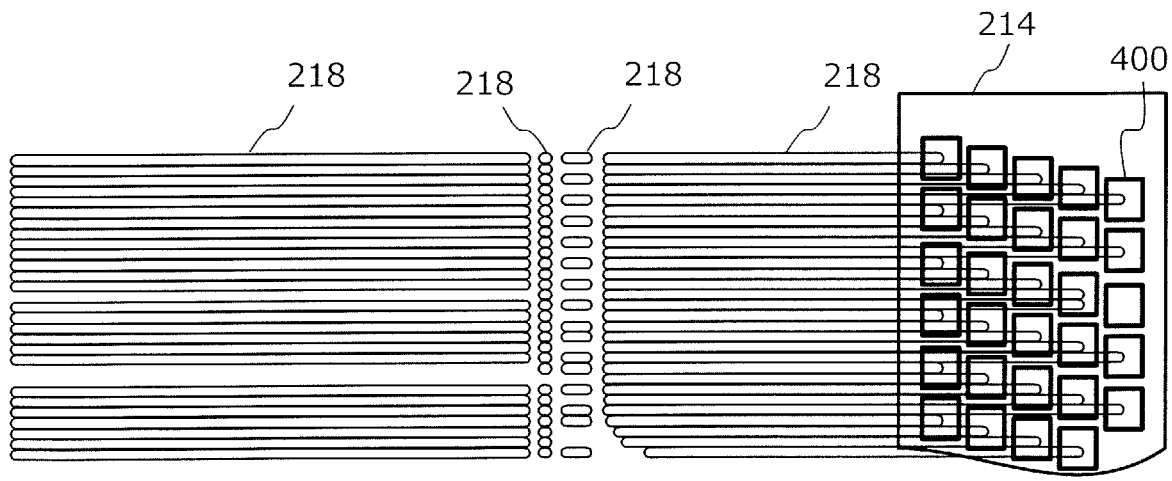
FIG. 28E is a plan view showing an example of irradiation regions formed by temporarily modulating the electric current flowing through each of the light emitting diode devices during scanning by the line beam source.

FIG. 28E is a plan view showing an example of irradiation regions formed by temporarily modulating the electric current flowing through each of the light emitting diode devices 400 during scanning by the line beam source 214. It is seen that a pattern of irradiation regions and non-irradiation regions can be formed with high spatial resolution.

Thus, according to the array of the light emitting diode devices 400 illustrated in FIG. 28A, modulation with high spatial resolution is possible as compared with the array of the light emitting diode devices 400 illustrated in FIG. 27A.

The irradiation with the lift-off light may be carried out while the plurality of light sources are kept stationary relative to the multilayer stack 100.

Figure 29:
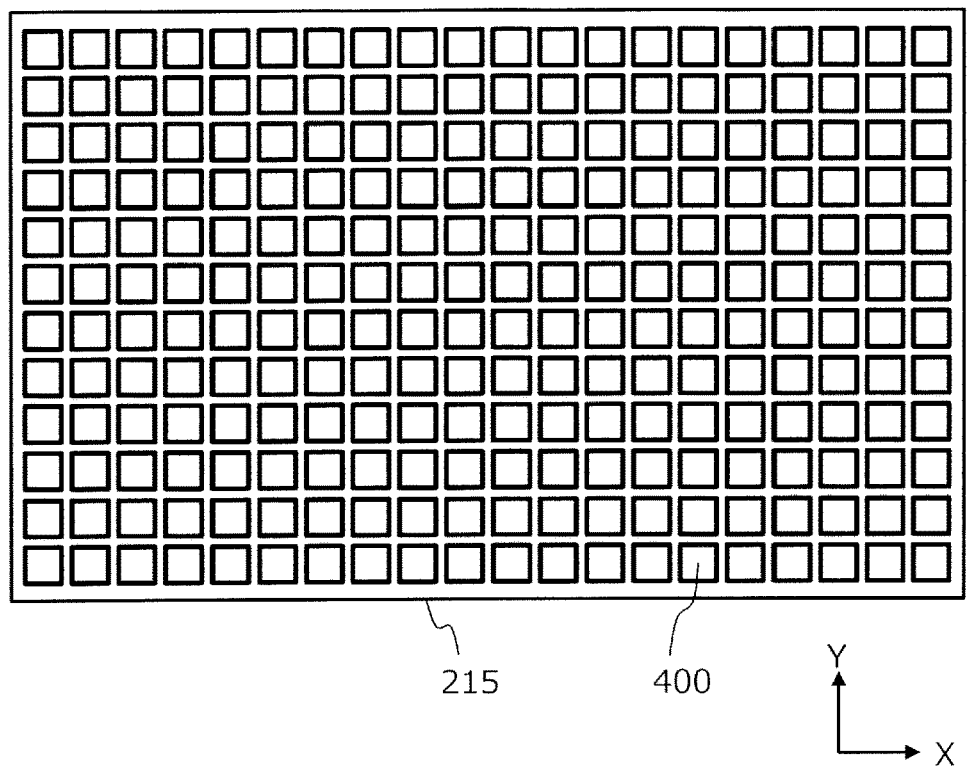
FIG. 29 is a top view schematically showing an example of the surface-emission light source in which a large number of light emitting diode devices are arrayed in a matrix.

FIG. 29 is a top view schematically showing an example of a surface-emission light source 215 in which a large number of light emitting diode devices 400 are arrayed in a matrix. The number of light emitting diodes arrayed vertically and horizontally only needs to be arbitrarily set according to the size of the substrate used. In this case, a delaminating apparatus applicable to G8-size substrates or huge substrates of still larger sizes can be realized. When the surface-emission light source 215 of this example is used, luminance distributions of various patterns can be formed as in displays. The surface-emission light source 215 may be connected to the driving circuit 280, and the driving circuit 280 may be connected to the controller 260.

When the irradiation with the lift-off light is carried out while both the multilayer stack 100 and the surface-emission light source 215 are kept stationary, a precise driving unit for light scanning is not necessary. When the irradiation with the lift-off light is carried out while the multilayer stack 100 is moved relative to a conventional stationary line beam light source, an area which is at least twice the area of the multilayer stack 100 is necessary for the movement of the multilayer stack 100. However, according to the embodiment of the present disclosure, an extra area for the movement of the multilayer stack 100 is not necessary, and the area for installing the apparatus will advantageously be halved.

Figure 30:
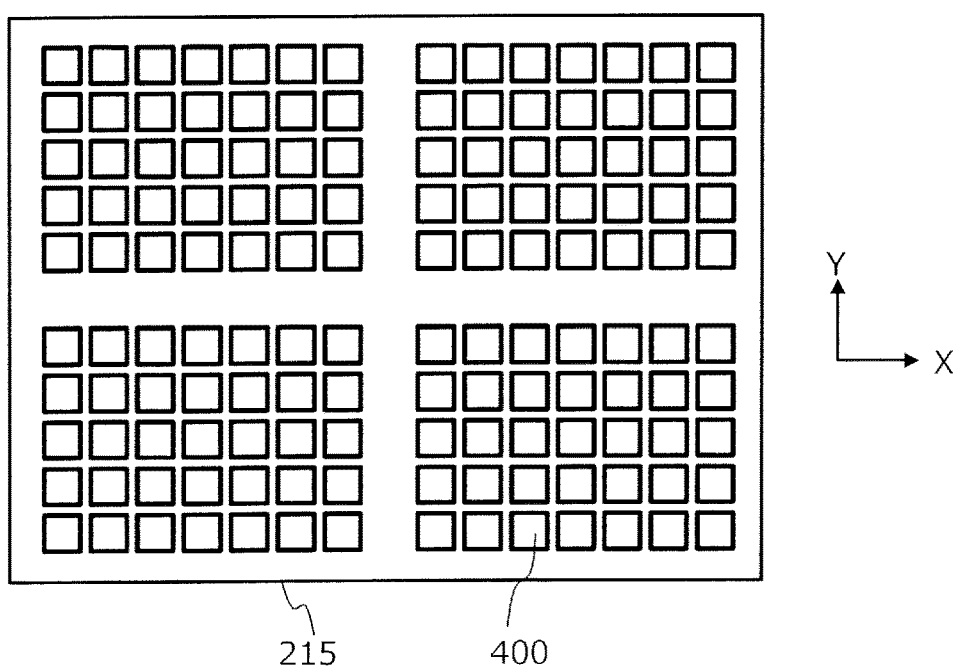
FIG. 30 is a top view schematically showing another example of the surface-emission light source in which a large number of light emitting diode devices are arrayed in a matrix.

FIG. 30 is a top view schematically showing another example of the surface-emission light source 215 in which a large number of light emitting diode devices 400 are arrayed in a matrix. In the surface-emission light source 215 of this example, the arrangement of the light emitting diode devices 400 is determined according to the irradiation regions for the lift-off light.

When the surface-emission light sources 215 shown in FIG. 29 and FIG. 30 are used, it is not necessary to carry out lift-off light irradiation while the surface-emission light source 215 is kept stationary relative to the multilayer stack 100. The irradiation with the lift-off light may be carried out while shifting the relative position of the surface-emission light source 215 to the multilayer stack 100. While the surface-emission light source 215 is kept stationary, the shape of the spatial distribution of the irradiation intensity can be changed by shifting the relative position of the surface-emission light source 215 to the multilayer stack 100 even if light radiated from the surface-emission light source 215 forms irradiation regions in the form of dots or lines over the delamination plane. The amount of the shift of the relative position of the surface-emission light source 215 to the multilayer stack 100 may be less than, or may be more than, the array pitch of the light emitting diode devices.

The plane to be delaminated may be divided into a plurality of regions, and each of the regions may be irradiated with a flash of the lift-off light in the same way as sequential exposure with the use of a stepper.

Thus, using light emitting diode devices enables irradiation with the lift-off light at a lower cost with the use of a large number of light sources rather than using semiconductor laser devices, which are relatively expensive. Further, the duration of radiation of the lift-off light from each of the light emitting diode devices can be easily increased. Therefore, even if the optical power of each of the light emitting diode devices is small, the irradiation energy required for delamination can be achieved by adjusting the irradiation duration. Furthermore, since laser light is not used, it is also advantageous from the viewpoint of safety for human eyes (eye-safe).

<Lift-Off>

Figure 16A:
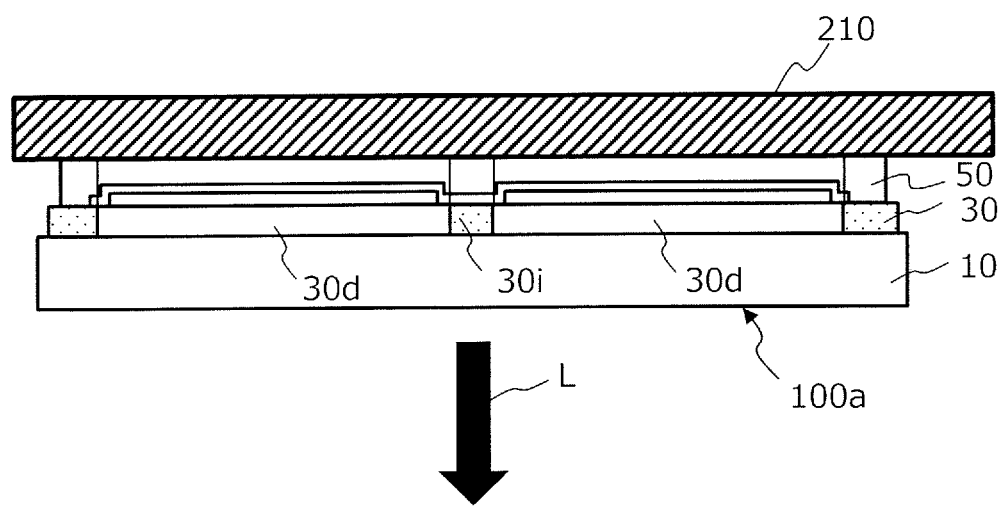
FIG. 16A is a cross-sectional view schematically showing the multilayer stack before the multilayer stack is separated into the first portion and the second portion after irradiation with lift-off light.

FIG. 16A illustrates a state where the multilayer stack 100 is in contact with the stage 210 after irradiation with the lift-off light. While this state is maintained, the distance from the stage 210 to the glass base 10 is increased. At this point in time, the stage 210 of the present embodiment holds a light-emitting device portion of the multilayer stack 100.

An unshown actuator holds the glass base 10 and moves the entirety of the glass base 10 in the direction of arrow L, thereby carrying out delaminating (lift-off). The glass base 10 can be moved together with an unshown chuck stage while being adhered by suction to the chuck stage. The direction of movement of the glass base 10 does not need to be vertical, but may be diagonal, to the first surface 100a of the multilayer stack 100. The movement of the glass base 10 does not need to be linear but may be rotational. Alternatively, the stage 210 may be moved upward in the drawing while the glass base 10 is secured by an unshown holder or another stage.

Figure 16B:
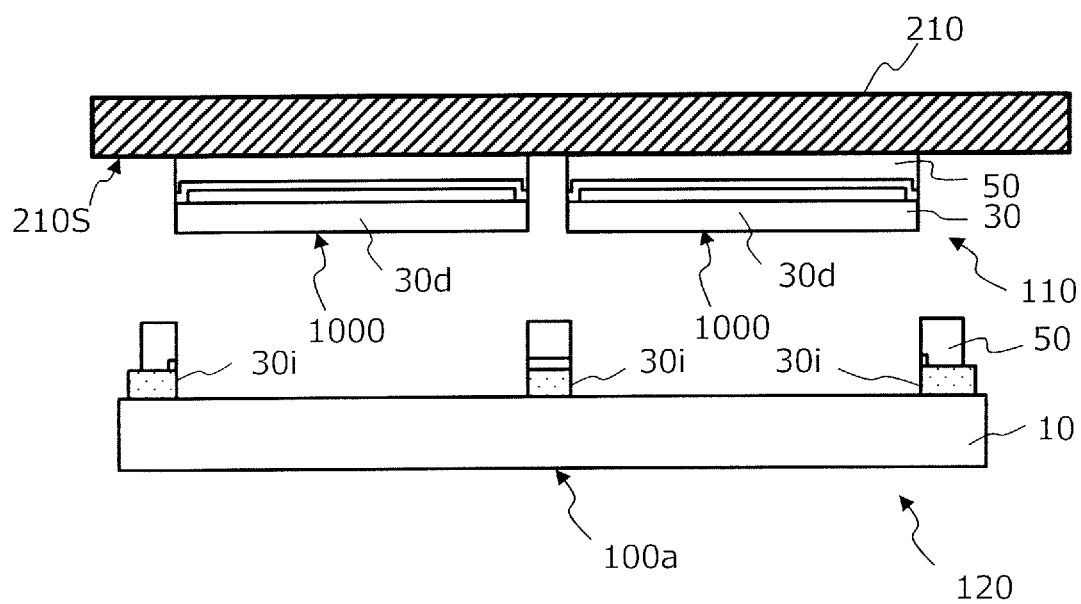
FIG. 16B is a cross-sectional view schematically showing the multilayer stack separated into the first portion and the second portion.
Figure 17:
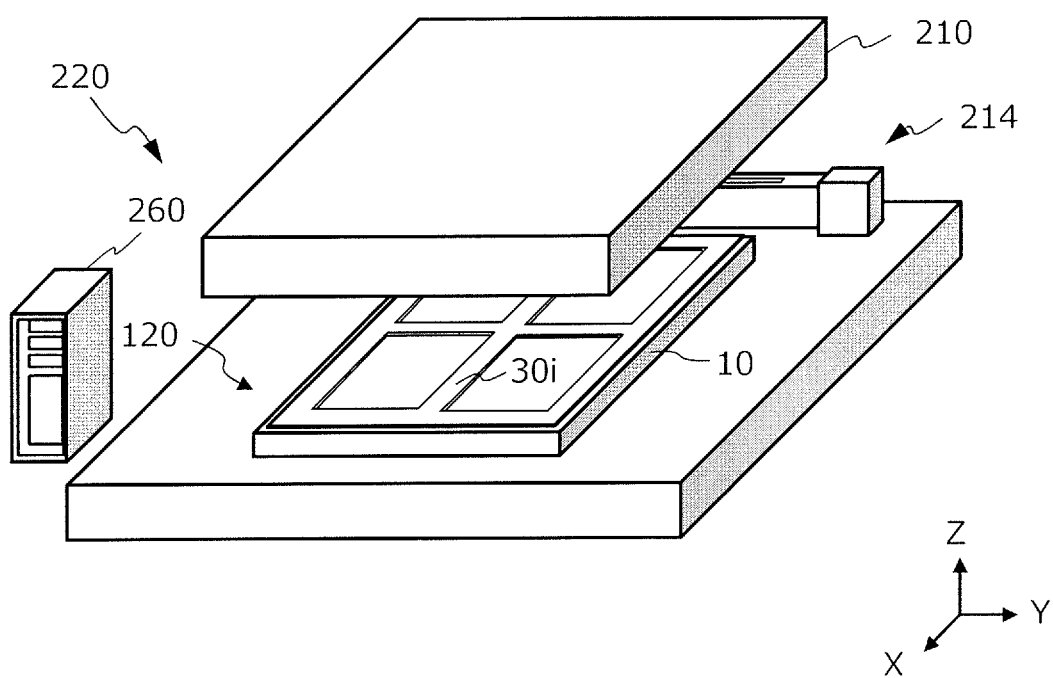
FIG. 17 is a perspective view showing the glass base separated from the multilayer stack by a delaminating apparatus.

FIG. 16B is a cross-sectional view showing the thus-separated first portion 110 and second portion 120 of the multilayer stack 100. FIG. 17 is a perspective view showing the second portion 120 of the multilayer stack 100. In FIG. 17, a guide rail 246 and other relevant components are not shown, and the shape of the intermediate region 30i is simplified such that the recesses and protrusions are not shown. The first portion 110 of the multilayer stack 100 includes a plurality of light-emitting devices 1000 which are in contact with the stage 210. The respective Light-emitting devices 1000 include the functional layer regions 20 and the plurality of flexible substrate regions 30d of the plastic film 30. Meanwhile, the second portion 120 of the multilayer stack 100 includes the glass base 10 and the intermediate region 30i of the plastic film 30. The intermediate region 30i of the plastic film 30 is bound to the glass base 10 in at least some low-irradiation regions. Thus, the entirety of the intermediate region 30i of the plastic film 30 separates from the stage 210 while the entirety of the intermediate region 30i is kept adhered to the glass base 10.

In the example of FIG. 17, both the irradiation process with the lift-off light and the delaminating process are carried out using the delaminating apparatus 220 that includes the stage 210. The embodiment of the present disclosure is not limited to this example. The irradiation process with the lift-off light may be carried out using a lift-off light irradiation unit which includes the stage 210, while the delaminating process is carried out using a different apparatus that includes another stage which is different from the stage 210. In this case, after irradiation with the lift-off light, it is necessary to transfer the multilayer stack 100 from the stage 210 to another unshown stage. When the same stage is used for carrying out both the irradiation process with the lift-off light and the delaminating process, the step of transferring the multilayer stack between the stages can be omitted.

As described above, in the present embodiment, the step of separating the multilayer stack 100 into the first portion 110 and the second portion 120 is carried out while the stage 210 holds the second surface 100b of the multilayer stack 100 by suction. The essence of this separation step resides in that an unnecessary part of the multilayer stack 100 which is not a constituent of the light-emitting device 1000 separates together with the glass base 10 from the stage 210. In the present embodiment, the cutting step illustrated in FIG. 2, i.e., the step of cutting a part of the multilayer stack 100 exclusive of the glass base 10 into the plurality of light-emitting devices 1000 and the remaining unnecessary portions, is carried out before irradiation with the lift-off light. Carrying out the cutting step before the lift-off light irradiation step is effective in realizing the separation illustrated in FIG. 16B and FIG. 17. In order that an unnecessary portion which is not a constituent of the light-emitting device 1000 remains on the glass base 10, the irradiation intensity of the lift-off light is modulated such that part of that unnecessary portion is kept bound to the glass base 10.

<Steps after Delaminating>

Figure 18:
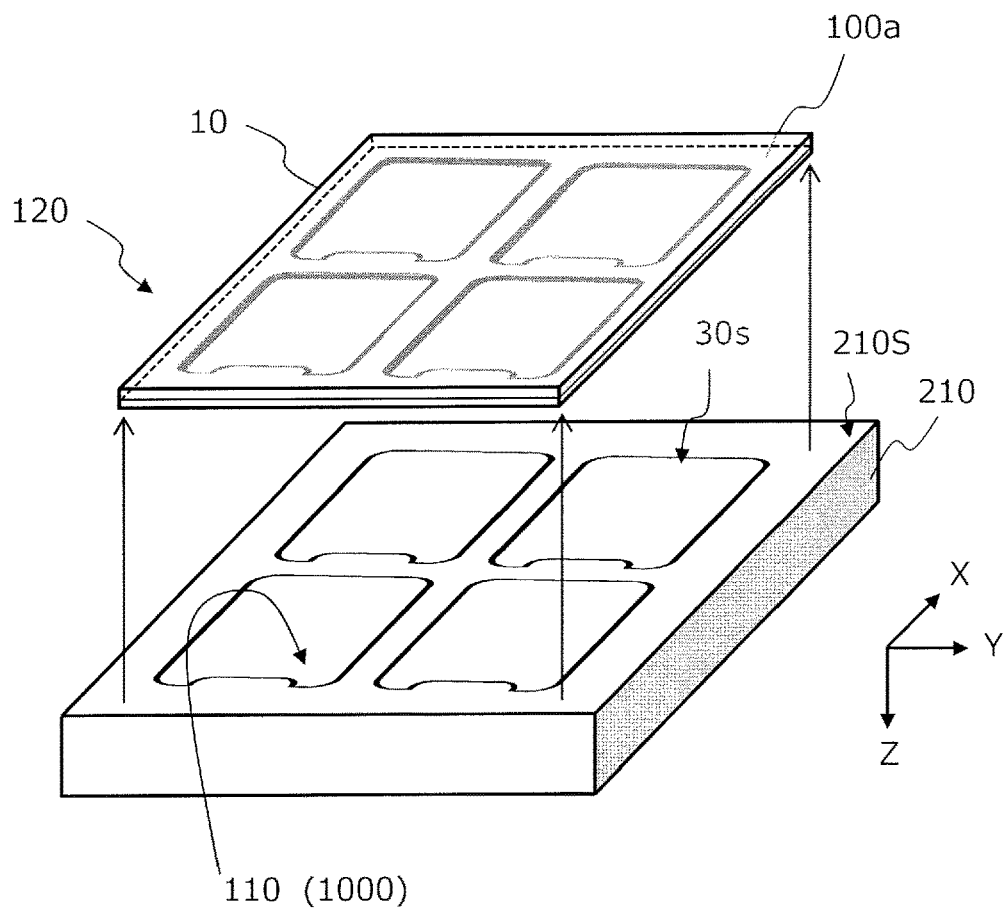
FIG. 18 is a perspective view showing removal of the glass base from the stage.

FIG. 18 is a perspective view showing the first portion 110 (light-emitting devices 1000) of the multilayer stack 100 adhered by suction to the stage 210 and the second portion 120 (the glass base 10 and objects bound thereto) at a position distant from the stage 210. Unnecessary portions of the multilayer stack 100 which are not constituents of the light-emitting devices 1000 are bound to the glass base 10.

Figure 19:
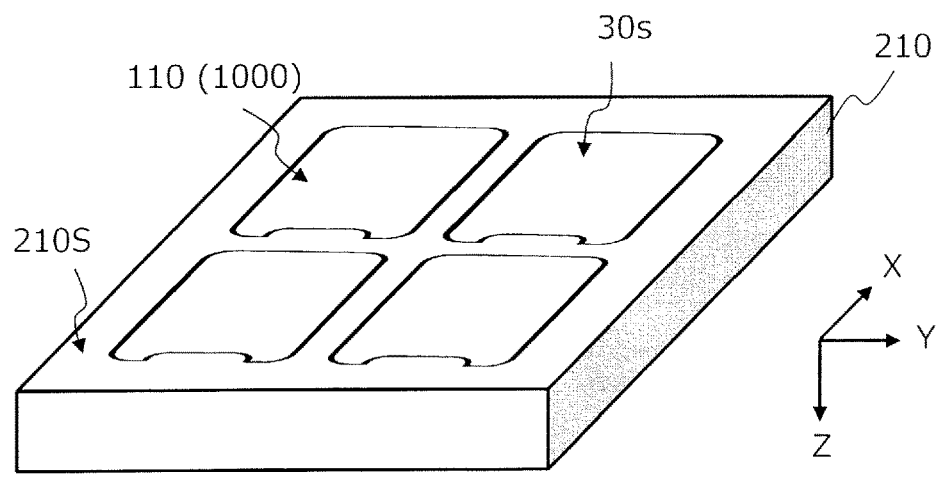
FIG. 19 is a perspective view showing the stage from which the glass base has been removed.

FIG. 19 is a perspective view showing the first portion 110 of the multilayer stack 100 adhered by suction to the stage 210. The first portion 110 of the multilayer stack 100 supported by the stage 210 includes a plurality of Light-emitting devices 1000 arrayed in rows and columns. In the example of FIG. 19, a part of the plastic film 30, specifically the surface (delaminated surface) 30s of the flexible substrate regions 30d, is exposed.

According to the present embodiment, the light-emitting devices 1000 can be appropriately separated from the remaining unnecessary portions even when the light-emitting devices 1000 and the flexible substrate regions 30d of the plastic film 30 which function as the flexible substrates for the light-emitting devices 1000 have complicated planar shapes such as those shown in FIG. 1A and other drawings. As previously described, this is realized by temporally changing the spatial distribution of the irradiation intensity of the lift-off light during scanning with the lift-off light such that an irradiation intensity which is necessary for delamination is selectively applied to the flexible substrate regions 30d of the plastic film 30. As a result, the entirety of the intermediate region 30i of the plastic film 30 can be kept bound to the glass base 10.

Figure 20:
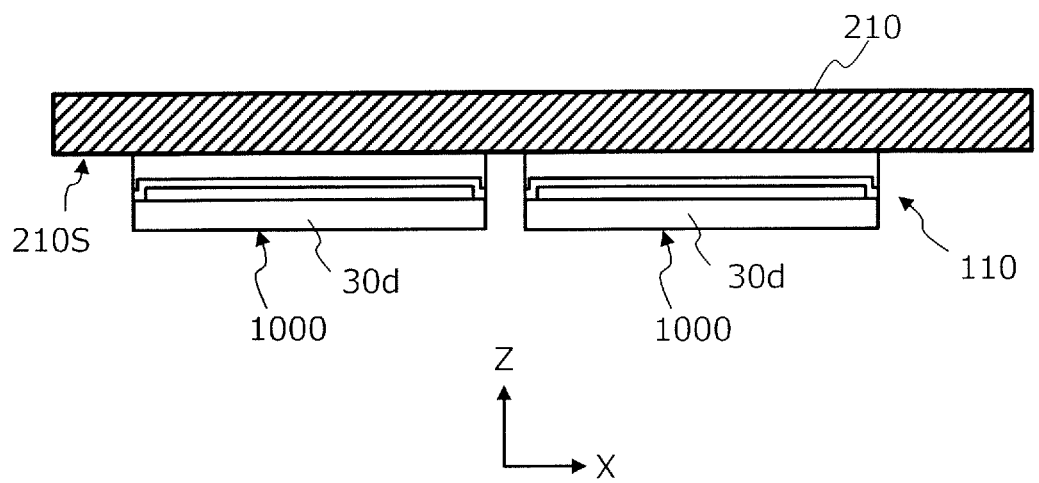
FIG. 20 is a cross-sectional view showing the stage from which the glass base has been removed.

FIG. 20 is a cross-sectional view showing that the stage 210 holds the light-emitting devices 1000 by suction. This cross section is parallel to the ZX plane. The direction of the Z-axis of FIG. 20 is opposite to the direction of the Z-axis of FIG. 18 and FIG. 19.

Various processes can be sequentially or concurrently performed on the plurality of light-emitting devices 1000 which are in contact with the stage 210.

The "processes" to be performed on the light-emitting devices 1000 can include attaching a dielectric and/or electrically-conductive film to each of the plurality of light-emitting devices 1000, cleaning or etching each of the plurality of light-emitting devices 1000, and mounting an optical part and/or an electronic part to each of the plurality of light-emitting devices 1000. Specifically, a part such as, for example, a polarizer, encapsulation film, touchscreen, heat radiation sheet, electromagnetic shield, driver integrated circuit, or the like, can be mounted to the flexible substrate region 30d of each of the light-emitting devices 1000. The sheet-like part includes a functional film which can add an optical, electrical or magnetic function to the light-emitting devices 1000.

The plurality of light-emitting devices 1000 are supported by the stage 210 such that the light-emitting devices 1000 are adhered by suction to the stage 210. The various processes which are to be performed on each of the light-emitting devices 1000 can be efficiently carried out.

The surface 30s of the plastic film 30 delaminated from the glass base 10 is active. Therefore, the surface 30s may be covered with a protection film or subjected to a surface treatment for conversion to a hydrophobic surface before various parts are mounted to the surface 30s.

Figure 21:
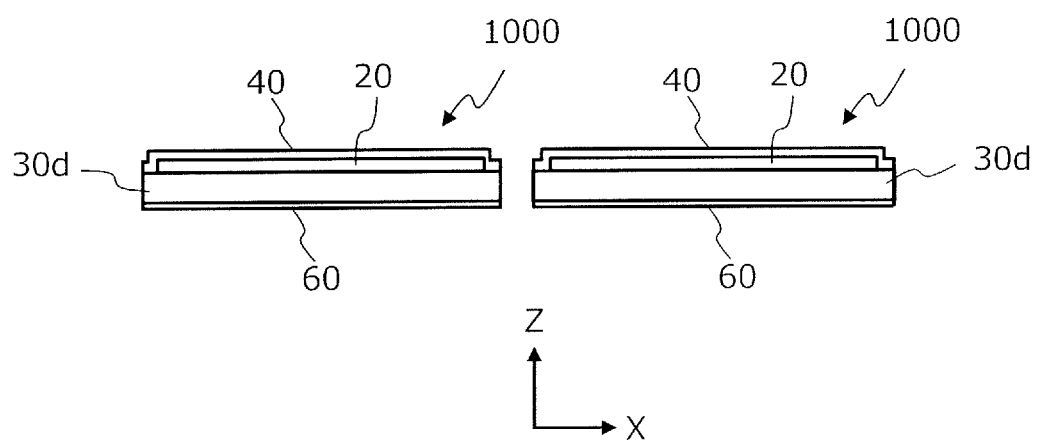
FIG. 21 is a cross-sectional view showing flexible light-emitting devices detached from the stage.

FIG. 21 is a cross-sectional view schematically showing the light-emitting devices 1000 detached from the stage 210 after the sheet-like part (functional film) 60 is mounted to the light-emitting devices 1000.

According to the prior art, the plastic film is delaminated from the glass base before the light-emitting devices 1000 are divided from one another. Therefore, when a subsequent process is carried out, a large number of light-emitting devices 1000 are bound to a single plastic film. Thus, it is difficult to carry out an efficient process on each of the light-emitting devices 1000. When the light-emitting devices 1000 are divided from one another after the sheet-like part is attached, a portion of the sheet-like part which is present in an intermediate region between adjoining two of the light-emitting devices 1000 is useless.

On the other hand, according to the embodiment of the present disclosure, a large number of light-emitting devices 1000 are still orderly arrayed on the stage 210 after being delaminated from the glass base 10. Therefore, various processes can be efficiently performed on the light-emitting devices 1000 sequentially or concurrently.

Figure 22:
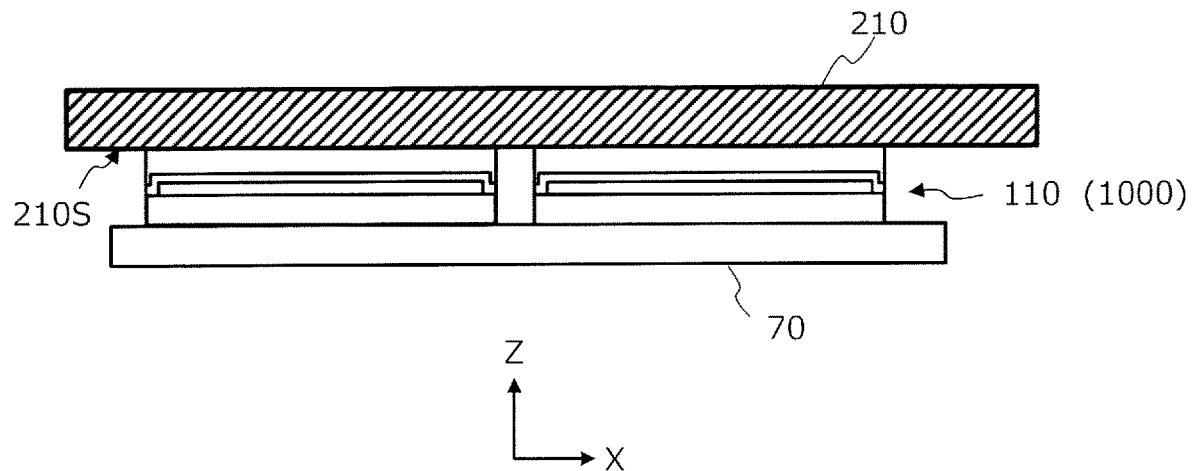
FIG. 22 is a cross-sectional view showing another protection sheet bound to a plurality of Light-emitting devices which are in contact with the stage.

After the step of separating the multilayer stack 100 into the first portion 110 and the second portion 120, the step of adhering another protection sheet (second protection sheet) 70 to the plurality of light-emitting devices 1000 which are in contact with the stage 210 may be further performed as shown in FIG. 22. The second protection sheet 70 can perform the function of temporarily protecting the surface of the flexible substrate regions 30d of the plastic film 30 delaminated from the glass base 10. The second protection sheet 70 can have the same laminate structure as that of the previously-described protection sheet 50. The protection sheet 50 can be referred to as "first protection sheet 50".

The second protection sheet 70 may be adhered to the plurality of light-emitting devices 1000 after various processes which have previously been described are performed on the plurality of light-emitting devices 1000 which are in contact with the stage 210.

When suction of the light-emitting devices 1000 by the stage 210 is stopped after the second protection sheet 70 is adhered, the plurality of light-emitting devices 1000 which are bound to the second protection sheet 70 can be detached from the stage 210. Thereafter, the second protection sheet 70 can function as a carrier for the plurality of light-emitting devices 1000. This is transfer of the light-emitting devices 1000 from the stage 210 to the second protection sheet 70. Various processes may be sequentially or concurrently performed on the plurality of light-emitting devices 1000 which are bound to the second protection sheet 70.

Figure 23:
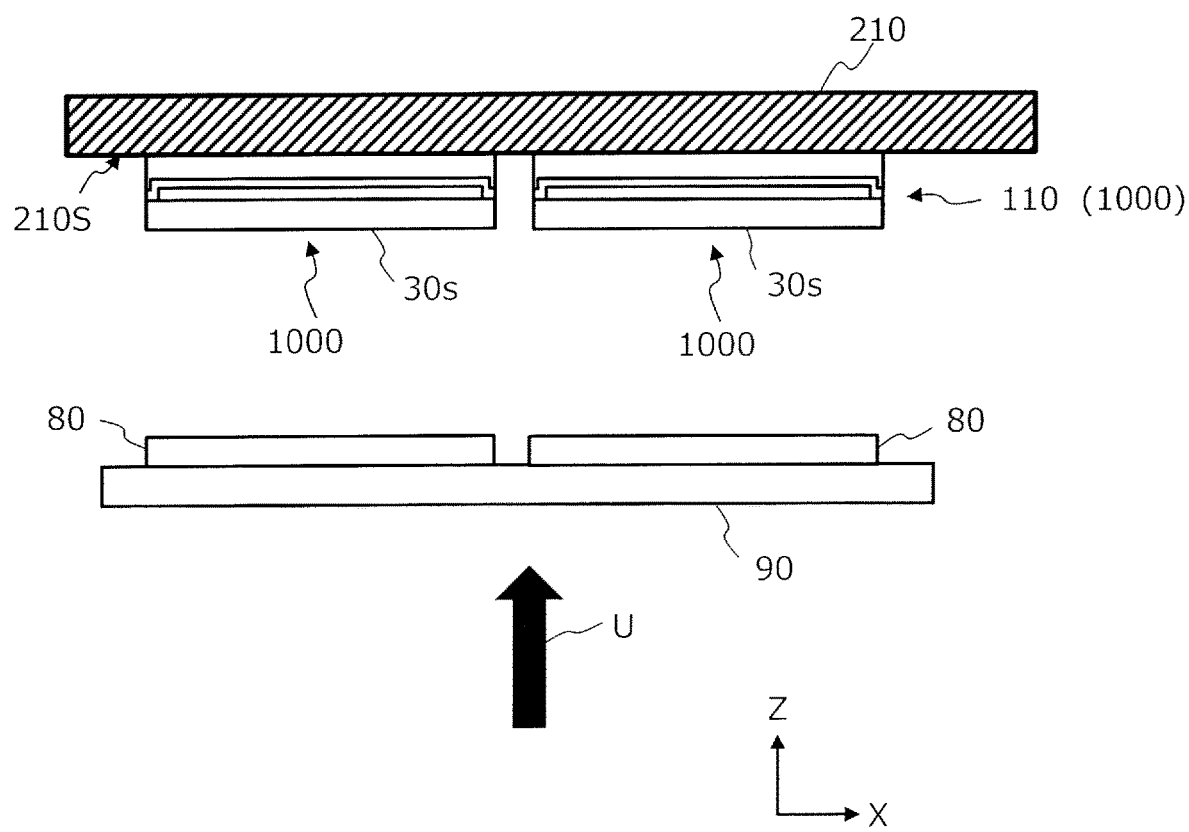
FIG. 23 is a cross-sectional view showing a carrier sheet carrying a plurality of parts which are to be mounted to the plurality of Light-emitting devices.

FIG. 23 is a cross-sectional view showing a carrier sheet 90 carrying a plurality of parts (functional films) 80 which are to be mounted to the plurality of light-emitting devices 1000. By moving this carrier sheet 90 in the direction of arrow U, the respective parts 80 can be attached to the light-emitting devices 1000. The upper surface of the parts 80 has an adhesive layer which is capable of strongly adhering to the light-emitting devices 1000. Meanwhile, the adhesion between the carrier sheet 90 and the parts 80 is relatively weak. Using such a carrier sheet 90 enables a simultaneous "transfer" of the parts 80. Such a transfer is readily realized because the plurality of light-emitting devices 1000 are regularly arrayed on the stage 210 while the light-emitting devices 1000 are supported by the stage 210.

Hereinafter, the configuration of the multilayer stack 100 before the dividing of FIG. 2 is described in more detail.

Figure 24A:
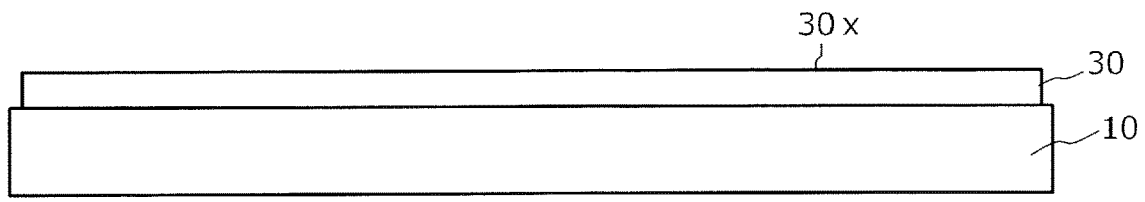
FIG. 24A is a cross-sectional view illustrating a step of the flexible light-emitting device production method in an embodiment of the present disclosure.

First, see FIG. 24A. FIG. 24A is a cross-sectional view showing the glass base 10 with the plastic film 30 provided on the surface of the glass base 10. The glass base 10 is a supporting substrate for processes. The thickness of the glass base 10 can be, for example, about 0.3-0.7 mm.

In the present embodiment, the plastic film 30 is a polyimide film having a thickness of, for example, not less than 5 µm and not more than 100 µm. The polyimide film can be formed from a polyamide acid, which is a precursor of polyimide, or a polyimide solution. The polyimide film may be formed by forming a polyamide acid film on the surface of the glass base 10 and then thermally imidizing the polyamide acid film. Alternatively, the polyimide film may be formed by forming, on the surface of the glass base 10, a film from a polyimide solution which is prepared by melting a polyimide or dissolving a polyimide in an organic solvent. The polyimide solution can be obtained by dissolving a known polyimide in an arbitrary organic solvent. The polyimide solution is applied to the surface 10s of the glass base 10 and then dried, whereby a polyimide film can be formed.

In the case of a bottom emission type flexible display, it is preferred that the polyimide film realizes high transmittance over the entire range of visible light. The transparency of the polyimide film can be represented by, for example, the total light transmittance in accordance with JIS K7105-1981. The total light transmittance can be set to not less than 80% or not less than 85%. On the other hand, in the case of a top emission type flexible display, it is not affected by the transmittance.

The plastic film 30 may be a film which is made of a synthetic resin other than polyimide. Note that, however, in the embodiment of the present disclosure, the process of forming a thin film transistor includes a heat treatment at, for example, not less than 350° C., and therefore, the plastic film 30 is made of a material which will not be deteriorated by this heat treatment.

The plastic film 30 may be a multilayer structure including a plurality of synthetic resin layers. In one form of the present embodiment, in delaminating a flexible display structure from the glass base 10, laser lift-off is carried out such that the plastic film 30 is irradiated with ultraviolet laser light transmitted through the glass base 10. A part of the plastic film 30 at the interface with the glass base 10 needs to absorb the ultraviolet laser light and decompose (disappear). Alternatively, for example, a sacrificial layer (thin metal or amorphous silicon layer) which is to absorb laser light of a certain wavelength band and produce a gas may be provided between the glass base 10 and the plastic film 30. In this case, the plastic film 30 can be easily delaminated from the glass base 10 by irradiating the sacrificial layer with the laser light. Providing the sacrificial layer also achieves the effect of suppressing generation of ashes.

<Polishing>

When there is an object (target) which is to be polished away, such as particles or protuberances, on the surface 30x of the plastic film 30, the target may be polished away using a polisher such that the surface becomes flat. Detection of a foreign object, such as particles, can be realized by, for example, processing of an image obtained by an image sensor. After the polishing process, a planarization process may be performed on the surface 30x of the plastic film 30. The planarization process includes the step of forming a film which improves the flatness (planarization film) on the surface 30x of the plastic film 30. The planarization film does not need to be made of a resin.

<Lower Gas Barrier Film>

Then, a gas barrier film may be formed on the plastic film 30. The gas barrier film can have various structures. Examples of the gas barrier film include a silicon oxide film and a silicon nitride film. Other examples of the gas barrier film can include a multilayer film including an organic material layer and an inorganic material layer. This gas barrier film may be referred to as "lower gas barrier film" so as to be distinguishable from a gas barrier film covering the functional layer regions 20, which will be described later. The gas barrier film covering the functional layer regions 20 can be referred to as "upper gas barrier film".

<Functional Layer Region>

Hereinafter, the process of forming the functional layer regions 20, including the TFT layer 20A and the light-emitting device layer 20B, and the upper gas barrier film 40 is described.

Figure 24B:
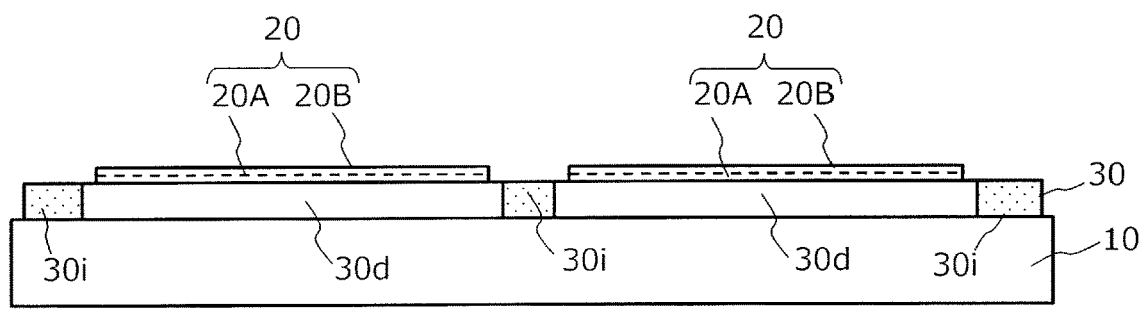
FIG. 24B is a cross-sectional view illustrating a step of the flexible light-emitting device production method in an embodiment of the present disclosure.

First, as shown in FIG. 24B, a plurality of functional layer regions 20 are formed on a glass base 10. There is a plastic film 30 between the glass base 10 and the functional layer regions 20. The plastic film 30 is bound to the glass base 10.

More specifically, the functional layer regions 20 include a TFT layer 20A (lower layer) and a light-emitting device layer 20B (upper layer). The TFT layer 20A and the light-emitting device layer 20B are sequentially formed by a known method. When the light-emitting device is a display, the TFT layer 20A includes a circuit of a TFT array which realizes an active matrix. The light-emitting device layer 20B includes an array of light-emitting devices (OLED devices and/or micro LED devices), each of which can be driven independently.

The chip size of the micro LED devices is, for example, smaller than 100 µm×100 µm. The micro LED devices can be made of different inorganic semiconductor materials according to the color or wavelength of light to be radiated. Identical semiconductor chips may include a plurality of semiconductor multilayer stacks of different compositions such that light of different colors, R (red), G (green) and B (blue), are radiated from the respective semiconductor multilayer stacks. As well known in the art, a semiconductor chip which radiates ultraviolet light or a semiconductor chip which radiates blue light may be combined with various phosphor materials such that light of R, G and B are radiated.

The thickness of the TFT layer 20A is, for example, about 4 µm. The thickness of the light-emitting device layer 20B including the OLED devices is, for example, 1 µm. The thickness of the light-emitting device layer 20B including the micro LED devices can be, for example, not less than 10 µm.

Figure 25:
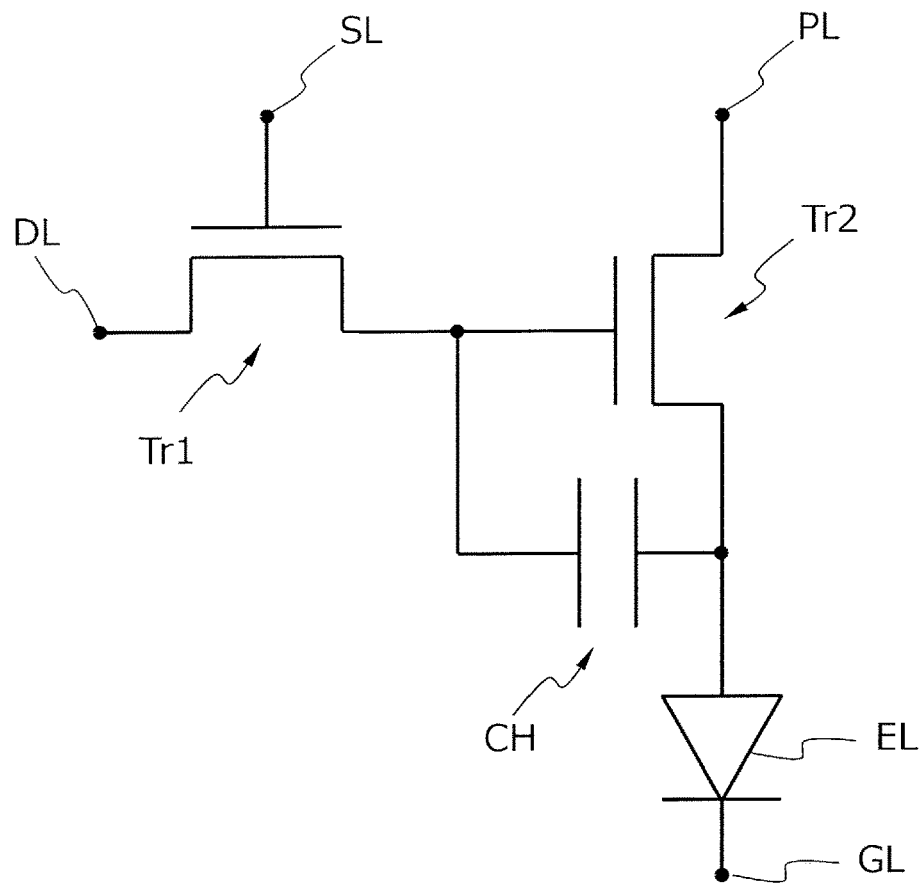
FIG. 25 is an equivalent circuit diagram of a single sub-pixel in a flexible light-emitting device.

FIG. 25 is a basic equivalent circuit diagram of a sub-pixel in a display. A single pixel of the display can consist of sub-pixels of different colors such as, for example, R (red), G (green), and B (blue). The example illustrated in FIG. 25 includes a selection TFT element Tr1, a driving TFT element Tr2, a storage capacitor CH, and a light-emitting device EL. The selection TFT element Tr1 is connected with a data line DL and a selection line SL. The data line DL is a line for transmitting data signals which define an image to be displayed. The data line DL is electrically coupled with the gate of the driving TFT element Tr2 via the selection TFT element Tr1. The selection line SL is a line for transmitting signals for controlling the ON/OFF state of the selection TFT element Tr1. The driving TFT element Tr2 controls the state of the electrical connection between a power line PL and the light-emitting device EL. When the driving TFT element Tr2 is ON, an electric current flows from the power line PL to a ground line GL via the light-emitting device EL. This electric current allows the light-emitting device EL to emit light. Even when the selection TFT element Tr1 is OFF, the storage capacitor CH maintains the ON state of the driving TFT element Tr2.

The TFT layer 20A includes a selection TFT element Tr1, a driving TFT element Tr2, a data line DL, and a selection line SL. The Light-emitting device layer 20B includes a light-emitting device EL. Before formation of the Light-emitting device layer 20B, the upper surface of the TFT layer 20A is planarized by an interlayer insulating film that covers the TFT array and various wires. A structure which supports the light-emitting device layer 20B and which realizes active matrix driving of the light-emitting device layer 20B is referred to as "backplane".

The circuit elements and part of the lines shown in FIG. 25 can be included in any of the TFT layer 20A and the light-emitting device layer 20B. The lines shown in FIG. 25 are connected with an unshown driver circuit.

In the embodiment of the present disclosure, the TFT layer 20A and the light-emitting device layer 20B can have various specific configurations. These configurations do not limit the present disclosure. The TFT element included in the TFT layer 20A may have a bottom gate type configuration or may have a top gate type configuration. Emission by the light-emitting device included in the light-emitting device layer 20B may be of a bottom emission type or may be of a top emission type. The specific configuration of the light-emitting device is also arbitrary.

The material of a semiconductor layer which is a constituent of the TFT element includes, for example, crystalline silicon, amorphous silicon, and oxide semiconductor. In the embodiment of the present disclosure, part of the process of forming the TFT layer 20A includes a heat treatment step at 350° C. or higher for the purpose of improving the performance of the TFT element.

<Upper Gas Barrier Film>

Figure 24C:
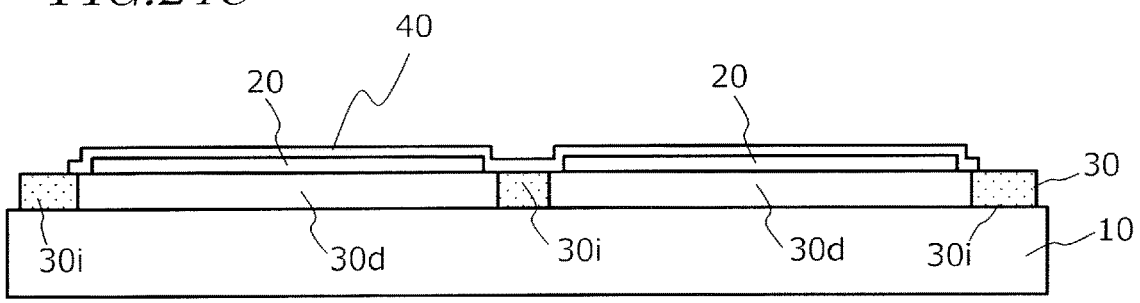
FIG. 24C is a cross-sectional view illustrating a step of the flexible light-emitting device production method in an embodiment of the present disclosure.

After formation of the above-described functional layer, the entirety of the functional layer regions 20 is covered with a gas barrier film (upper gas barrier film) 40 as shown in FIG. 24C. A typical example of the upper gas barrier film 40 is a multilayer film including an inorganic material layer and an organic material layer. Elements such as an adhesive film, another functional layer which is a constituent of a touch-screen, polarizers, etc., may be provided between the upper gas barrier film 40 and the functional layer regions 20 or in a layer overlying the upper gas barrier film 40. Formation of the upper gas barrier film 40 can be realized by a Thin Film Encapsulation (TFE) technique. When the light-emitting device layer 20B includes OLED devices, from the viewpoint of encapsulation reliability, the WVTR (Water Vapor Transmission Rate) of a thin film encapsulation structure is typically required to be not more than $1 \times 10^{-4}$ g/m²/day. According to the embodiment of the present disclosure, this criterion is met. The thickness of the upper gas barrier film 40 is, for example, not more than 1.5 µm.

Figure 26:
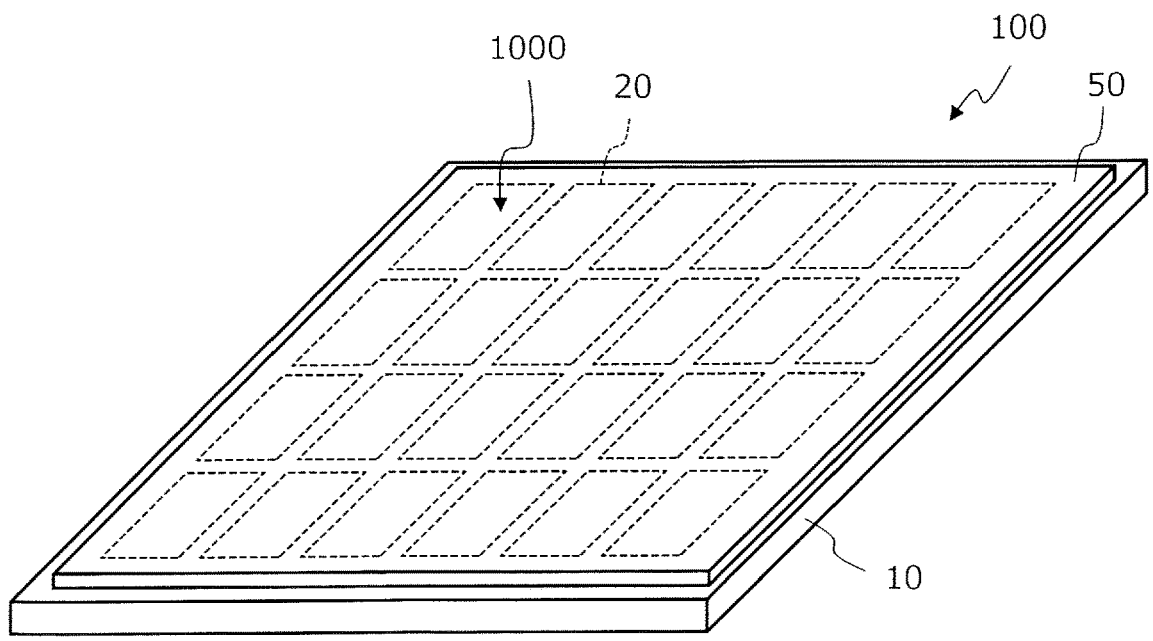
FIG. 26 is a perspective view of the multilayer stack in the middle of the production process.

FIG. 26 is a perspective view schematically showing the upper surface side of the multilayer stack 100 at a point in time when the upper gas barrier film 40 is formed. A single multilayer stack 100 includes a plurality of light-emitting devices 1000 supported by the glass base 10. In the example illustrated in FIG. 26, a single multilayer stack 100 includes a larger number of functional layer regions 20 than in the example illustrated in FIG. 1A. As previously described, the number of functional layer regions 20 supported by a single glass base 10 is arbitrary.

<Protection Sheet>

Figure 24D:
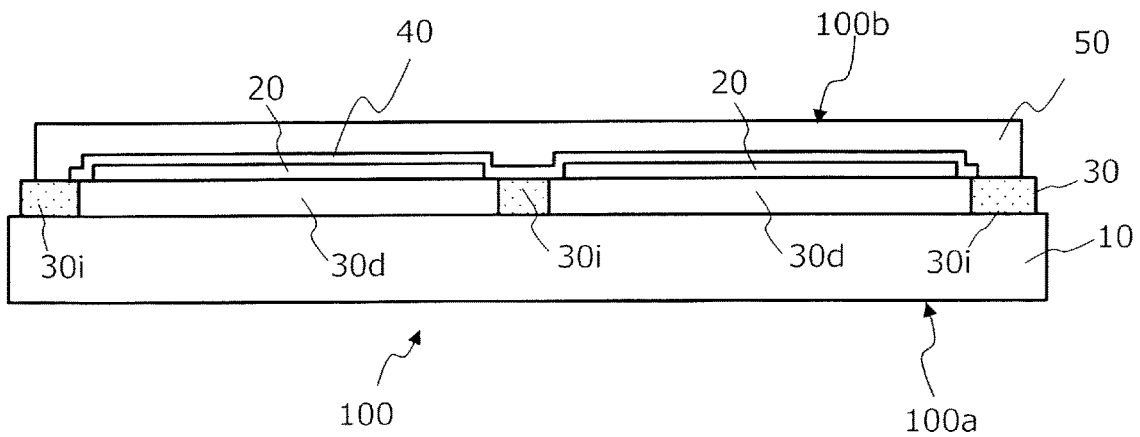
FIG. 24D is a cross-sectional view illustrating a step of the flexible light-emitting device production method in an embodiment of the present disclosure.

Next, refer to FIG. 24D. As shown in FIG. 24D, a protection sheet 50 is adhered to the upper surface of the multilayer stack 100. The protection sheet 50 can be made of a material such as, for example, polyethylene terephthalate (PET), polyvinyl chloride (PVC), or the like. As previously described, a typical example of the protection sheet 50 has a laminate structure which includes a layer of an applied mold-releasing agent at the surface. The thickness of the protection sheet 50 can be, for example, not less than 50 µm and not more than 200 µm.

After the thus-formed multilayer stack 100 is provided, the production method of the present disclosure can be carried out using the above-described production apparatus (delaminating apparatus 220).

INDUSTRIAL APPLICABILITY

An embodiment of the present invention provides a novel flexible light-emitting device production method. A flexible light-emitting device is broadly applicable to smartphones, tablet computers, on-board displays, and small-, medium- and large-sized television sets. The flexible light-emitting device can also be used as an illumination device.

REFERENCE SIGNS LIST

10 . . . glass base, 20 . . . functional layer region, 20A . . . TFT layer, 20B . . . light-emitting device layer, 30 . . . plastic film, 30d . . . flexible substrate region of plastic film, 30i . . . intermediate region of plastic film, 40 . . . gas barrier film, 50 . . . protection sheet, 100 . . . multilayer stack, 210 . . . stage, 220 . . . lift-off light irradiation unit (delaminating apparatus), 260 . . . controller, 300 . . . semiconductor laser device, 1000 . . . light-emitting device.

The invention claimed is:

1. A method for producing a flexible light-emitting device, comprising:
providing a multilayer stack which has a first surface and a second surface, the multilayer stack including
a glass base which defines the first surface,
a functional layer region including a TFT layer and a light-emitting device layer,
a synthetic resin film provided between the glass base and the functional layer region and bound to the glass base, the synthetic resin film including a flexible substrate region supporting the functional layer region and an intermediate region surrounding the flexible substrate region, and
a protection sheet which covers the functional layer region and which defines the second surface;
dividing the intermediate region and the flexible substrate region of the synthetic resin film from each other;
irradiating an interface between the synthetic resin film and the glass base with lift-off light; and
separating the multilayer stack into a first portion and a second portion by increasing a distance from a stage to the glass base while the second surface of the multilayer stack is kept in contact with the stage,
wherein the first portion of the multilayer stack includes a light-emitting device which is in contact with the stage, the light-emitting device including the functional layer region and the flexible substrate region of the synthetic resin film,
the second portion of the multilayer stack includes the glass base and the intermediate region of the synthetic resin film, and
irradiating the interface between the synthetic resin film and the glass base with the lift-off light includes;
forming the lift-off light from a plurality of arranged light sources and temporally and spatially modulating a power of the plurality of light sources according to a shape of the flexible substrate region of the synthetic resin film;
reducing an irradiation intensity of the lift-off light for at least part of an interface between the intermediate region of the synthetic resin film and the glass base below a threshold level of the irradiation intensity which is necessary for delamination;
irradiating the at least part of the interface between the intermediate region of the synthetic resin film and the glass base with the lift-off light,
irradiating the interface between the flexible substrate region of the synthetic resin film and the glass base with the lift-off light whose irradiation intensity is higher than threshold level,
wherein, after separating the multilayer stack into the first portion and the second portion, performing a process on the light-emitting device which is in contact with the stage, and
the process includes attaching a dielectric and/or electrically-conductive film to the light-emitting device, cleaning or etching the plurality of light-emitting device, and mounting an optical part and/or an electronic part to the light-emitting device.

2. The method of claim 1, wherein the lift-off light is incoherent light.

3. The method of claim 1, wherein
the light-emitting device layer includes a plurality of arrayed micro LEDs, and
the lift-off light is laser light.

4. The method of claim 1, wherein a shape of the flexible substrate region of the synthetic resin film has a cutout, a protrusion, and/or a curved contour when viewed in a direction perpendicular to the first surface.

5. The method of claim 1, wherein
a number of the flexible substrate region of the synthetic resin film is plural, and
a number of the light-emitting device included in the first portion of the multilayer stack is plural.

6. The method of claim 1, wherein
the plurality of light sources are a plurality of light emitting diode devices, and
irradiating the interface between the synthetic resin film and the glass base with the lift-off light includes modulating a driving current flowing through each of the plurality of light emitting diode devices, thereby temporally and/or spatially modulating the irradiation intensity of the lift-off light.

7. The method of claim 6, wherein the plurality of light emitting diode devices are arranged in a single row or a plurality of rows.

8. The method of claim 7, wherein
an arrangement pitch of the plurality of light emitting diode devices is in a range of not less than 3 mm and not more than 10 mm.

9. The method of claim 1, wherein
the lift-off light is a line beam extending in a first direction which is parallel to a perimeter of the glass base, and
irradiating the interface between the synthetic resin film and the glass base with the lift-off light includes moving an irradiation region on the interface which is to be irradiated with the lift-off light in a second direction which is transverse to the first direction.

10. The method of claim 1, wherein
the lift-off light is plane-like light extending in a first direction and a second direction, the first direction being parallel to a perimeter of the glass base, the second direction being transverse to the first direction, and
irradiating the interface between the synthetic resin film and the glass base with the lift-off light includes moving or not-moving irradiation region on the interface which is to be irradiated with the lift-off light.

11. The method of claim 9, wherein
the at least part of the interface between the intermediate region of the synthetic resin film and the glass base includes a plurality of parallel stripe regions extending in the first direction, and
any of the plurality of parallel stripe regions includes a large-width portion and/or a narrow-width portion.

12. The method of claim 9, wherein
the at least part of the interface between the intermediate region of the synthetic resin film and the glass base includes a plurality of parallel stripe regions extending in the second direction, and
any of the plurality of parallel stripe regions includes a large-width portion and/or a narrow-width portion.

13. The method of claim 1, wherein the at least part of the interface between the intermediate region of the synthetic resin film and the glass base has a width which is not less than 50% of a width of the intermediate region.

14. The method of claim 1, wherein the at least part of the interface between the intermediate region of the synthetic resin film and the glass base has a width which is not less than 1 mm.

15. The method of claim 1, wherein the difference between an irradiation intensity of the lift-off light in the at least part of the interface between the intermediate region of the synthetic resin film and the glass base and an irradiation intensity of the lift-off light for the interface between the flexible substrate region of the synthetic resin film and the glass base is not less than 50 mJ/cm$^2$.

\* \* \* \* \*